United States Patent
Tanzawa

(10) Patent No.: US 10,748,918 B2
(45) Date of Patent: Aug. 18, 2020

(54) METHODS OF FORMING SEMICONDUCTOR DEVICE STRUCTURES INCLUDING STAIRCASE STRUCTURES

(71) Applicant: Micron Technology, Inc., Boise, ID (US)

(72) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/875,407

(22) Filed: Jan. 19, 2018

(65) Prior Publication Data

US 2018/0145029 A1    May 24, 2018

Related U.S. Application Data

(62) Division of application No. 15/095,401, filed on Apr. 11, 2016, now Pat. No. 9,905,514.

(51) Int. Cl.
*H01L 27/11575* (2017.01)
*H01L 27/11582* (2017.01)

(52) U.S. Cl.
CPC .. *H01L 27/11575* (2013.01); *H01L 27/11582* (2013.01)

(58) Field of Classification Search
CPC ................... H01L 27/11582; H01L 27/11575
See application file for complete search history.

(56) References Cited

U.S. PATENT DOCUMENTS

| 6,141,250 | A | 10/2000 | Kashimura |
| 7,852,676 | B2 | 12/2010 | Maejima |
| 8,227,897 | B2* | 7/2012 | Kim .................... H01L 23/5228 257/536 |
| 8,284,601 | B2 | 10/2012 | Son et al. |
| 8,405,142 | B2 | 3/2013 | Katsumata et al. |
| 8,530,350 | B2 | 9/2013 | Freeman et al. |

(Continued)

OTHER PUBLICATIONS

Jang et al., Vertical Cell Array Using TCAT (Terabit Cell Array Transistory) Technology for Ultra High Density NAND Flash Memory, 2009 Symposium on VLSI Technology Digest of Technical Papers, (2009), pp. 192-193.

(Continued)

*Primary Examiner* — Vongsavanh Sengdara
(74) *Attorney, Agent, or Firm* — TraskBritt

(57) ABSTRACT

A semiconductor device structure comprises stacked tiers each comprising a conductive structure and an insulating structure longitudinally adjacent the at least one conductive structure, at least one staircase structure having steps comprising lateral ends of the stacked tiers, and an opening laterally adjacent a first side of the at least one staircase structure and extending through the stacked tiers and continuously across an entire length of the at least one staircase structure. Conductive structures of the stacked tiers laterally extend from the steps of the at least one staircase structure completely across a second side of the at least one staircase structure opposing the first side to form continuous conductive paths laterally extending completely across the stacked tiers. Additional semiconductor device structures, methods of forming semiconductor device structures, and electronic systems are also described.

15 Claims, 18 Drawing Sheets

(56) References Cited

U.S. PATENT DOCUMENTS

| | | |
|---|---|---|
| 8,609,536 B1 | 12/2013 | Ha et al. |
| 8,614,917 B2 | 12/2013 | Shim et al. |
| 8,796,778 B2 | 8/2014 | Tanzawa |
| 2009/0268522 A1 | 10/2009 | Maejima |
| 2009/0268523 A1 | 10/2009 | Maejima |
| 2009/0310415 A1 | 12/2009 | Jin et al. |
| 2011/0244666 A1 | 10/2011 | Kim et al. |
| 2012/0091413 A1 | 4/2012 | Nguyen et al. |
| 2012/0119287 A1* | 5/2012 | Park .................. H01L 27/11519 257/329 |
| 2012/0306089 A1 | 12/2012 | Freeman et al. |
| 2013/0146980 A1 | 6/2013 | Tanzawa |
| 2013/0161821 A1* | 6/2013 | Hwang ............. H01L 27/11551 257/773 |
| 2014/0061747 A1* | 3/2014 | Tanzawa ........... H01L 29/66833 257/314 |
| 2014/0138840 A1 | 5/2014 | Ha et al. |
| 2014/0241026 A1 | 8/2014 | Tanzawa |
| 2014/0347929 A1 | 11/2014 | Tanzawa |
| 2015/0001613 A1* | 1/2015 | Yip ....................... H01L 27/115 257/329 |
| 2015/0200200 A1 | 7/2015 | Sakuma et al. |
| 2016/0172371 A1 | 6/2016 | Kim |
| 2016/0233229 A1 | 8/2016 | Oh et al. |
| 2017/0062337 A1 | 3/2017 | Park et al. |

OTHER PUBLICATIONS

Katsumata et al., Pipe-Shaped BiCs Flash Memory with 16 Stacked Layers and Multi-Level-Cell Operation for Ultra High Density Storage Devices, 2009 Symposium on VLSI Technology Digest of Technical Papers, (2009), pp. 136-137.

Kim et al., Multi-Layered Vertical Gate NAND Flash Oversoming Stacking Limit for Terabit Density Storage, 2009 Symposium on VLSI Technology Digest of Technical Papers, (2009), pp. 188-189.

Kim et al., Novel Vertical-Stacked-Array-Transistor (VSAT) for Ultra-High-Density and Cost-Effective NAND Flash Memory Devices and SSD (Solid State Drive), 2009 Symposium on VLSI Technology Digest of Technical Papers, (2009), pp. 186-187.

* cited by examiner

METHODS OF FORMING SEMICONDUCTOR DEVICE STRUCTURES INCLUDING STAIRCASE STRUCTURES

CROSS-REFERENCE TO RELATED APPLICATION

This application is a divisional of U.S. patent application Ser. No. 15/095,401, filed Apr. 11, 2016, now U.S. Pat. No. 9,905,514, issued Feb. 27, 2018 the disclosure of which is hereby incorporated herein in its entirety by this reference.

TECHNICAL FIELD

The disclosure, in various embodiments, relates generally to the field of semiconductor device design and fabrication. More specifically, the disclosure relates to semiconductor device structures including staircase structures, and to related methods and electronic systems.

BACKGROUND

A continuing goal of the semiconductor industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A typical vertical memory array includes semiconductor pillars extending through openings in tiers of conductive structures (e.g., word line plates, control gate plates) and dielectric materials at each junction of the semiconductor pillars and the conductive structures. Such a configuration permits a greater number of switching devices (e.g., transistors) to be located in a unit of die area by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., word lines) so that memory cells in the vertical memory array can be uniquely selected for writing, reading, or erasing operations. One method of forming such an electrical connection includes forming a so-called "staircase" or "stair step" structure at edges of the tiers of conductive structures. The staircase structure includes individual "steps" defining contact regions of the conductive structures upon which contact structures can be positioned to provide electrical access to the conductive structures. Unfortunately, conventional staircase structure fabrication techniques can segment one or more conductive structures of a given tier, resulting in discontinuous conductive paths through the tier that can require the use of multiple (e.g., more than one) switching devices to drive voltages completely across the tier and/or in opposing directions across the tier. In addition, as the number of tiers of conductive structures increases the number of interconnections required to drive voltages across the tiers also increases, requiring undesirable increases in the lateral dimensions of the tiers and/or of the steps of the staircase structures associated with the tiers to accommodate the increased number of interconnections and circumvent undesirable capacitive coupling between the interconnections.

There remains a need for new semiconductor device structures, such as memory array blocks for 3D non-volatile memory devices (e.g., 3D NAND Flash memory devices), as well as for associated memory devices and electronic systems including the semiconductor device structures, and simple, cost-efficient methods of forming semiconductor device structures.

DETAILED DESCRIPTION

Figure 1A:
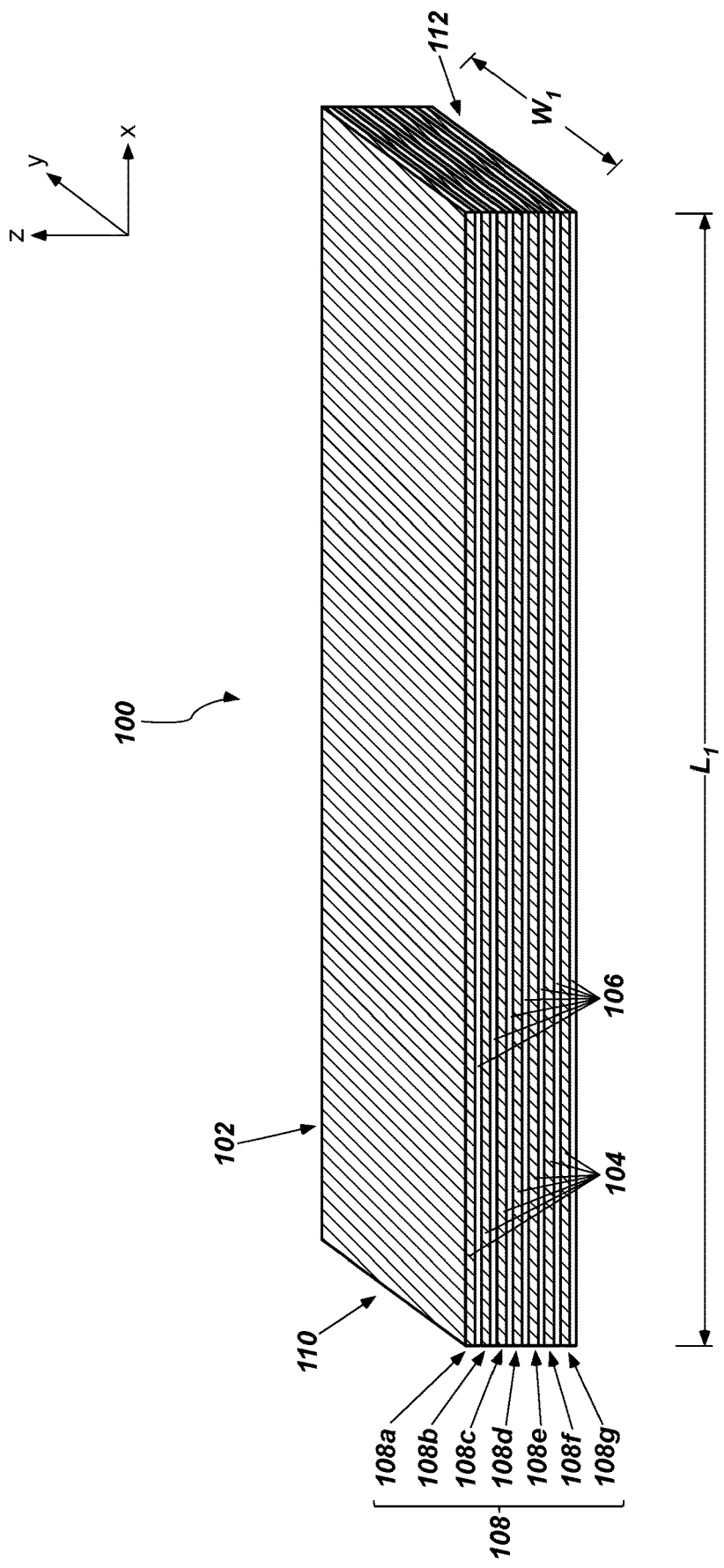
FIGS. 1A through 7B are perspective (FIGS. 1A, 2A, 3A, 4A, 5A, 5C, 6A, and 7A) and top-down (FIGS. 1B, 2B, 3B, 4B, 5B, 5D, 6B, 7B, and 7C) views illustrating methods of forming a semiconductor device structure, in accordance with embodiments of the disclosure.

Semiconductor device structures (e.g., memory array blocks) including staircase structures are described, as are related methods and electronic systems. In some embodiments, a semiconductor device structure includes a stack structure having opposing end sections exhibiting a first width and an interior section laterally intervening between the opposing end sections and exhibiting a second width smaller than the first width. The stack structure includes stacked tiers each comprising at least one conductive structure and at least one insulating structure longitudinally adjacent the conductive structure, one or more staircase structures within the interior section and including steps defined by lateral ends of the stacked tiers, and an elongate middle region laterally adjacent the one or more staircase structures within the interior section and laterally extending completely between the opposing end sections. The conductive structures of the stacked tiers may form continuous conductive paths laterally extending completely across the stacked tiers. The semiconductor device structure may also include contact structures coupled to the conductive structures of the stacked tiers at steps of the one or more staircase structures, and routing structures coupled to the contact structures and extending from the contact structures, through an opening adjacent the one or more staircase structures, and to at least one string driver device. The structures and methods of the disclosure may permit individual (e.g., single) switching devices (e.g., transistors, such as field effect transistors (FETs)) of a string driver device electrically connected to one or more conductive structures of an individual tier to drive voltages completely across and/or in opposing directions across the tier. In addition, the structures and methods of the disclosure may permit one or more portions of the interconnections (e.g., one or more portions of the routing structures, one or more portions of the contact structures) utilized to drive voltages across different tiers to be spaced farther apart from one another without increasing the lateral dimensions of the tiers so as to reduce the risk of undesirable capacitive coupling between the interconnections while maintaining desirable feature dimensions. The structures and methods of the disclosure may decrease the number of switching devices and interconnections required to effectively operate a memory device, and may increase one or more of memory device performance, scalability, efficiency, and simplicity as compared to many conventional structures and methods.

The following description provides specific details, such as material compositions and processing conditions, in order to provide a thorough description of embodiments of the present disclosure. However, a person of ordinary skill in the art would understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device (e.g., a memory device). The semiconductor device structures described below do not form a complete semiconductor device. Only those process acts and structures necessary to understand the embodiments of the present disclosure are described in detail below. Additional acts to form a complete semiconductor device from the semiconductor device structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the terms "vertical", "longitudinal", "horizontal", and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, and arrangement of one or more of at least one structure and at least one apparatus facilitating operation of one or more of the structure and the apparatus in a pre-determined way.

As used herein, the phrase "coupled to" refers to structures operatively connected with each other, such as electrically connected through a direct ohmic connection or through an indirect connection (e.g., via another structure).

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "about" in reference to a given parameter is inclusive of the stated value and has the meaning dictated by the context (e.g., it includes the degree of error associated with measurement of the given parameter).

FIGS. 1A through 7C are simplified perspective (FIGS. 1A, 2A, 3A, 4A, 5A, 5C, 6A, and 7A) and top-down (FIGS. 1B, 2B, 3B, 4B, 5B, 5D, 6B, 7B, and 7C) views illustrating embodiments of methods of forming a semiconductor device structure including a staircase structure, such as a memory array structure (e.g., a memory array block) for a 3D non-volatile memory device (e.g., a 3D NAND Flash memory device). With the description provided below, it will be apparent to one of ordinary skill in the art that the methods described herein may be used in various devices. In other words, the methods of the disclosure may be used whenever it is desired to form a semiconductor device including a staircase structure.

Figure 1B:
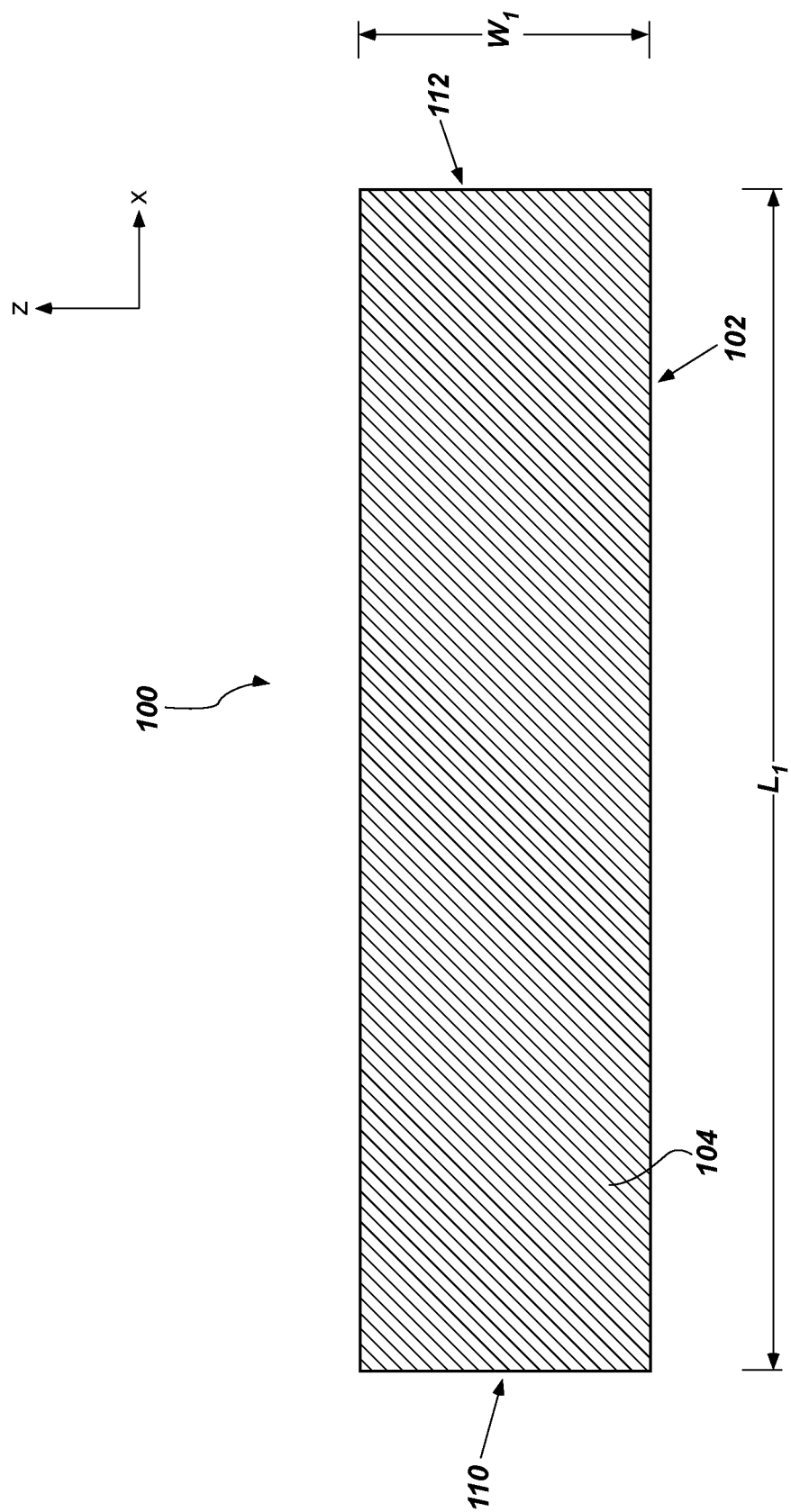

Referring to FIG. 1A, a semiconductor device structure 100 may include a stack structure 102 exhibiting an alternating sequence of conductive structures 104 and insulating structures 106 arranged in tiers 108. Each of the tiers 108 may include one of the conductive structures 104 and one of the insulating structures 106. For clarity and ease of understanding of the drawings and related description, FIG. 1A shows the stack structure 102 as including seven (7) tiers 108 (i.e., tiers 108a through 108g) of the conductive structures 104 and the insulating structures 106. However, the stack structure 102 may include a different number of tiers 108. For example, in additional embodiments, the stack structure 102 may include greater than seven (7) tiers 108 (e.g., greater than or equal to ten (10) tiers 108, greater than or equal to fifteen (15) tiers 108, greater than or equal to twenty-five (25) tiers 108, greater than or equal to fifty (50) tiers 108, greater than or equal to one hundred (100) tiers 108) of the conductive structures 104 and the insulating structures 106, or may include less than seven (7) tiers 108 (e.g., less than or equal to five (5) tiers 108, less than or equal to three (3) tiers 108) of the conductive structures 104 and the insulating structures 106. FIG. 1B is a top-down view of the semiconductor device structure 100 at the processing stage depicted in FIG. 1A.

The conductive structures 104 may be formed of and include at least one conductive material, such as a metal (e.g., tungsten, titanium, molybdenum, niobium, vanadium, hafnium, tantalum, chromium, zirconium, iron, ruthenium, osmium, cobalt, rhodium, iridium, nickel, palladium, platinum, copper, silver, gold, aluminum), a metal alloy (e.g., a cobalt-based alloy, an iron-based alloy, a nickel-based alloy, an iron- and nickel-based alloy, a cobalt- and nickel-based alloy, an iron- and cobalt-based alloy, a cobalt- and nickel- and iron-based alloy, an aluminum-based alloy, a copper-based alloy, a magnesium-based alloy, a titanium-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped silicon, conductively-doped germanium, conductively-doped silicon germanium), or combinations thereof. Each of the conductive structures 104 may independently include a substantially homogeneous distribution or a substantially heterogeneous distribution of the at least one conductive material. As used herein, the term "homogeneous distribution" means amounts of a material do not vary throughout different portions (e.g., different lateral and longitudinal portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the structure. In some embodiments, each of the conductive structures 104 exhibits a substantially homogeneous distribution of conductive material. In additional embodiments, at least one of the conductive structures 104 exhibits a substantially heterogeneous distribution of at least one conductive material. The conductive structure 104 may, for example, be formed of and include a stack of at least two different conductive materials. The conductive structures 104 may each be substantially planar, and may each independently exhibit any desired thickness. Each of the conductive structures 104 may be substantially the same (e.g., exhibit substantially the same material composition, material distribution, size, and shape) as one another, or at least one of the conductive structures 104 may be different (e.g., exhibit one or more of a different material composition, a different material distribution, a different size, and a different shape) than at least one other of the conductive structures 104. In some embodiments, each of the conductive structures 104 is substantially the same as each other of the conductive structures 104.

The insulating structures 106 may be formed of and include at least one insulating material, such as one or more of an oxide material (e.g., silicon dioxide, phosphosilicate glass, borosilicate glass, borophosphosilicate glass, fluorosilicate glass, titanium dioxide, zirconium dioxide, hafnium dioxide, tantalum oxide, magnesium oxide, aluminum oxide, or a combination thereof), a nitride material (e.g., silicon nitride), an oxynitride material (e.g., silicon oxynitride), and amphorous carbon. Each of the insulating structures 106 may independently include a substantially homogeneous distribution or a substantially heterogeneous distribution of the at least one insulating material. In some embodiments, each of the insulating structures 106 exhibits a substantially homogeneous distribution of insulating material. In additional embodiments, at least one of the insulating structures 106 exhibits a substantially heterogeneous distribution of at least one conductive material. One or more of the insulating structures 106 may, for example, be formed of and include a stack (e.g., laminate) of at least two different insulating materials. In some embodiments, each of the insulating structures 106 is formed of and includes silicon dioxide. The insulating structures 106 may each be substantially planar, and may each independently exhibit a desired thickness. In addition, each of the insulating structures 106 may be substantially the same (e.g., exhibit substantially the same material composition, material distribution, size, and shape) as one another, or at least one of the insulating structures 106 may be different (e.g., exhibit one or more of a different material composition, a different material distribution, a different size, and a different shape) than at least one other of the insulating structures 106. In some embodiments, each of the insulating structures 106 is substantially the same as each other of the insulating structures 106.

As shown in FIG. 1A, in some embodiments, the alternating sequence of the conductive structures 104 and the insulating structures 106 begins with one of the insulating structures 106. In additional embodiments, the conductive structures 104 and the insulating structures 106 exhibit a different arrangement relative to one another. By way of non-limiting example, the conductive structures 104 and the insulating structures 106 may be arranged in an alternating sequence beginning with one of the conductive structures 104. A semiconductor device (e.g., a vertical memory device, such as a 3D NAND Flash memory device) employing a semiconductor device structure having such a configuration may have little or no difference in terms of functionality or operability as compared to a semiconductor device employing the arrangement of the conductive structures 104 and the insulating structures 106 shown in FIG. 1A. In some embodiments, each of the tiers 108 includes one of the conductive structures 104 on or over one of the insulating structures 106. In additional embodiments, each of the tiers 108 includes one of the insulating structures 106 on or over one of the conductive structures 104.

The stack structure 102 may exhibit an elongate shape (e.g., a rectangular shape) extending (e.g., in the X-direction) between a first end 110 and a second, opposing end 112. The first end 110 and the second, opposing end 112 of the stack structure 102 may each be, or may each later become, coupled to other components of a semiconductor device (e.g., a memory device) including the semiconductor device structure 100, such as one or more memory cell arrays (e.g., vertical memory cell arrays).

The stack structure 102, including the each of the tiers 108 thereof, may be formed using conventional processes (e.g., conventional deposition processes, conventional material removal processes) and conventional processing equipment, which are not described in detail herein. By way of non-limiting example, the conductive structures 104 and the insulating structures 106 may be formed through one or more of in situ growth, spin-on coating, blanket coating, chemical vapor deposition (CVD), plasma enhanced chemical vapor deposition (PECVD), atomic layer deposition (ALD), and physical vapor deposition (PVD).

Figure 2A:
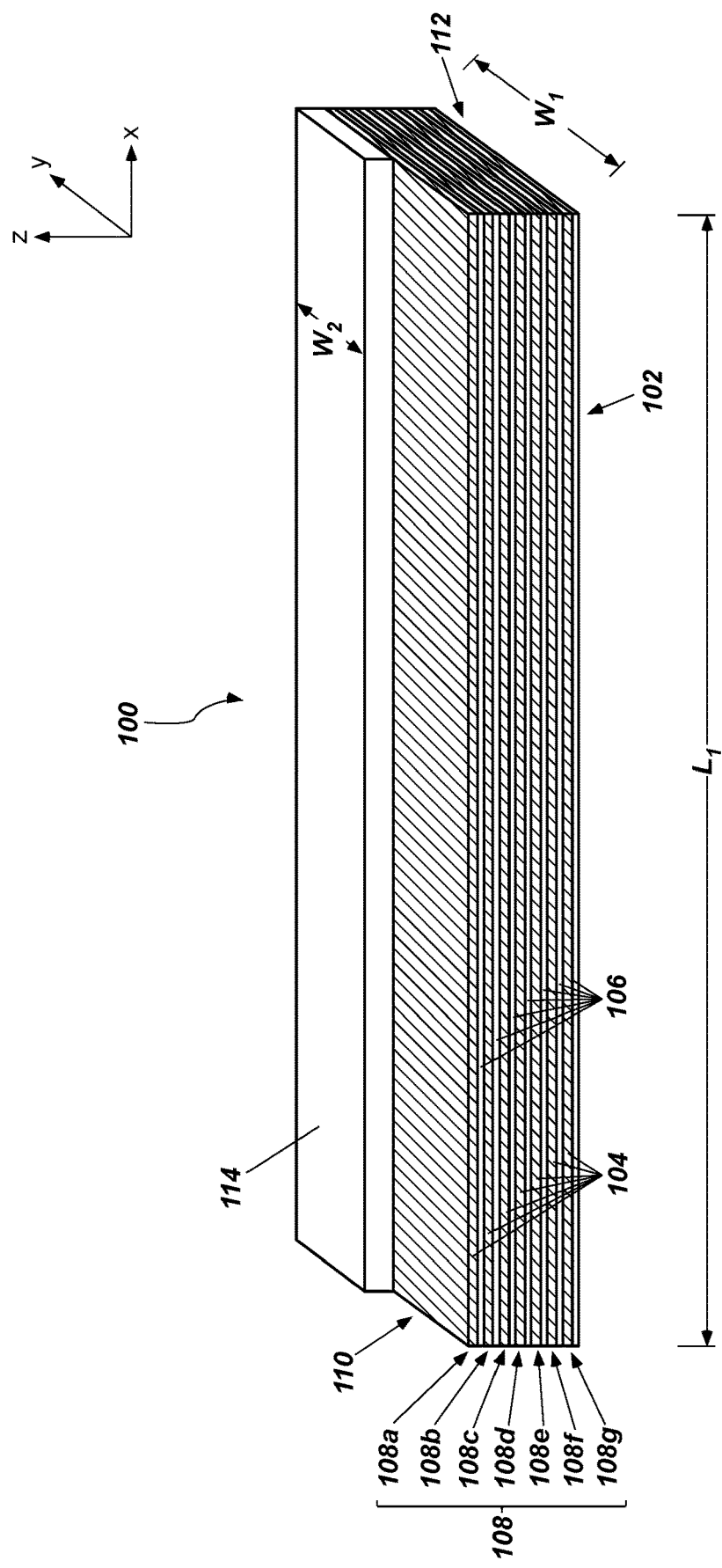
Figure 2B:
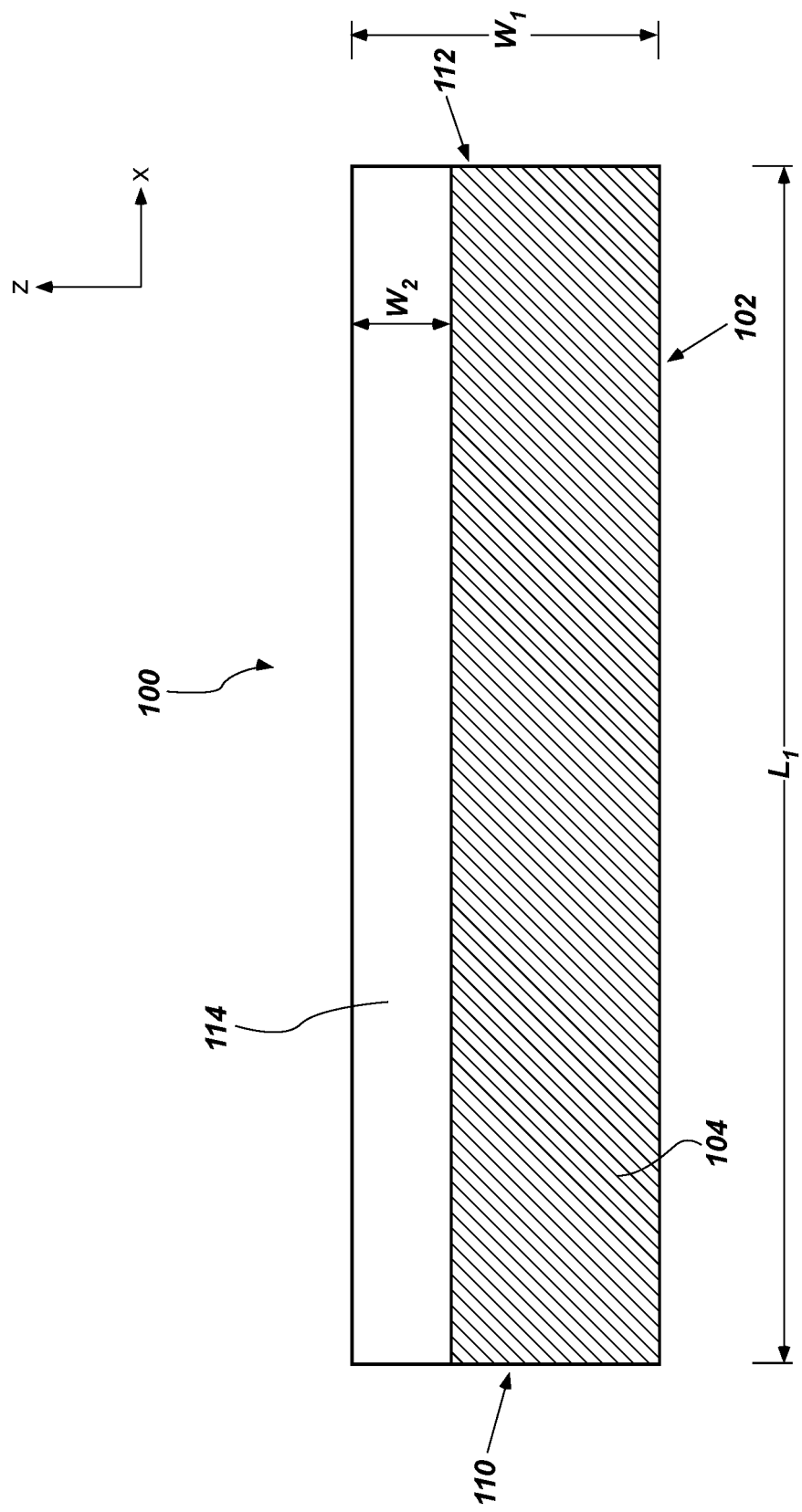

Referring next to FIG. 2A, a masking structure 114 may be formed on or over the stack structure 102. The masking structure 114 may be formed of and include at least one material (e.g., at least one hard mask material) suitable for use as an etch mask to pattern portions of the stack structure 102 (e.g., portions of the tiers 108, including portions of the conductive structures 104 and portions of the insulating structures 106, remaining uncovered by the masking structure 114) to form at least one staircase structure, as described in further detail below. By way of non-limiting example, the masking structure 114 may be formed of and include at least one of amorphous carbon, silicon, a silicon oxide, a silicon nitride, a silicon oxycarbide, aluminum oxide, and a silicon oxynitride. The masking structure 114 may be homogeneous (e.g., may comprise a single material layer), or may be heterogeneous (e.g., may comprise a stack exhibiting at least two different material layers). FIG. 2B is a top-down view of the semiconductor device structure 100 at the processing stage depicted in FIG. 2A.

The position and dimensions of the masking structure 114 may be selected at least partially based on desired positions and desired dimensions of one or more staircase structures to be subsequently formed in the stack structure 102. By way of non-limiting example, as shown in FIG. 2A, the masking structure 114 may be non-centrally positioned on or over the stack structure 102 in the Y-direction, may have a width $W_2$ less than the width $W_1$ of the stack structure 102, and may have substantially the same length $L_1$ as the stack structure 102. Widths of portions of the stack structure 102 remaining uncovered by (e.g., not underlying) the masking structure 114 may correspond to widths of the one or more staircase structures to be subsequently formed in the stack structure 102. In additional embodiments, the masking structure 114 may exhibit one or more of a different position (e.g., a different position in one or more of the X-direction and the Y-direction), a different width $W_2$, and a different length (e.g., a length less than the length $L_1$). As a non-limiting example, the masking structure 114 may be non-centrally positioned on or over the stack structure 102 in the Y-direction, may be centrally positioned on or over the stack structure 102 in the X-direction, may have a width $W_2$ less than the width $W_1$ of the stack structure 102, and may have a length less than the length $L_1$ of the stack structure 102. As another non-limiting example, the masking structure 114 may be centrally positioned over the stack structure 102 in each of the Y-direction and the X-direction, may have a width $W_2$ less than the width $W_1$ of the stack structure 102, and may have a length less than the length $L_1$ of the stack structure 102. As a further non-limiting example, the masking structure 114 may be centrally positioned over the stack structure 102 in each of the Y-direction and the X-direction, may have a width $W_2$ less than the width $W_1$ of the stack structure 102, and may have substantially the same length $L_1$ as the stack structure 102. The masking structure 114 may be formed on or over the stack structure 102 to any desired thickness.

The masking structure 114 may be formed using conventional processes (e.g., conventional deposition processes, such as at least one of in situ growth, spin-on coating, blanket coating, CVD, PECVD, ALD, and PVD, conventional photolithography processes, conventional material removal processes) and conventional processing equipment, which are not described in detail herein.

Figure 3A:
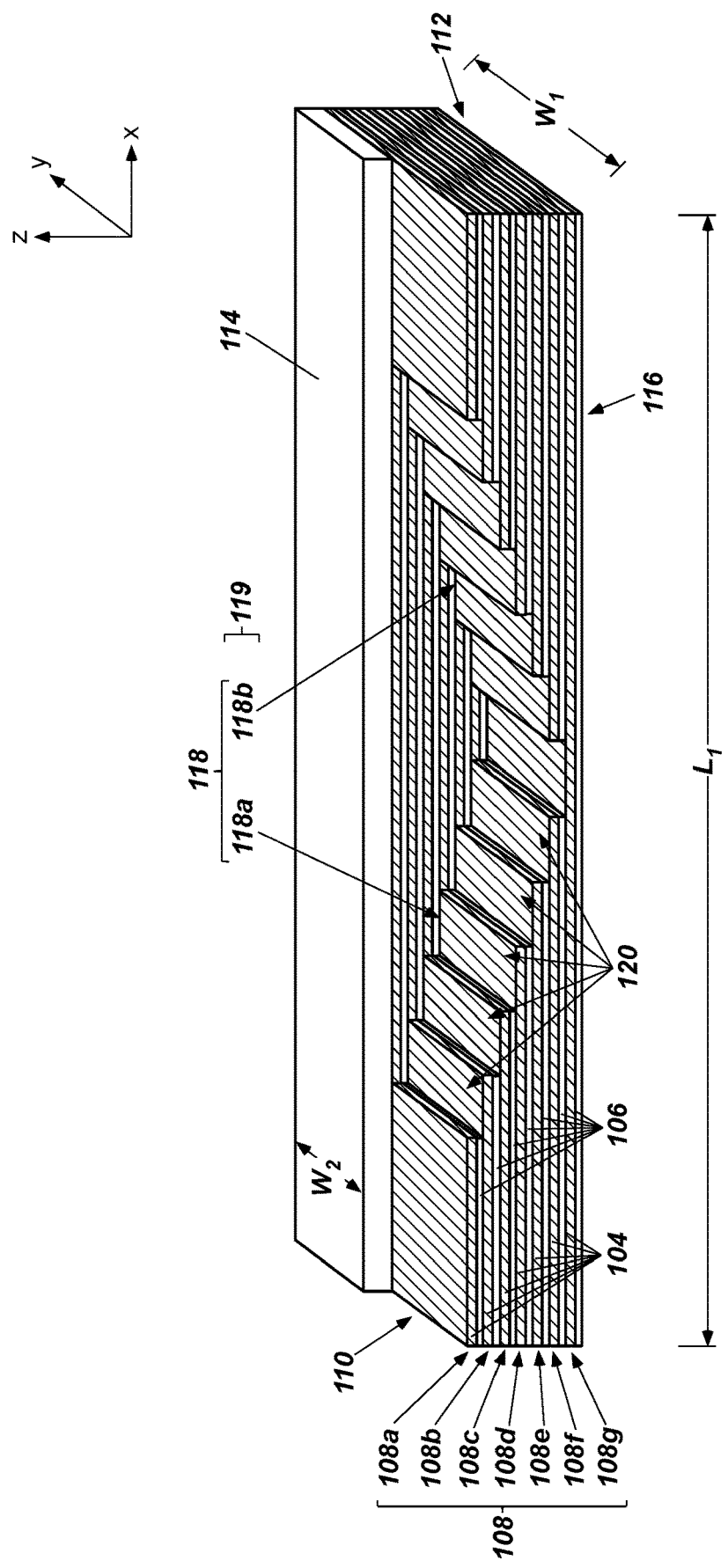
Figure 3B:
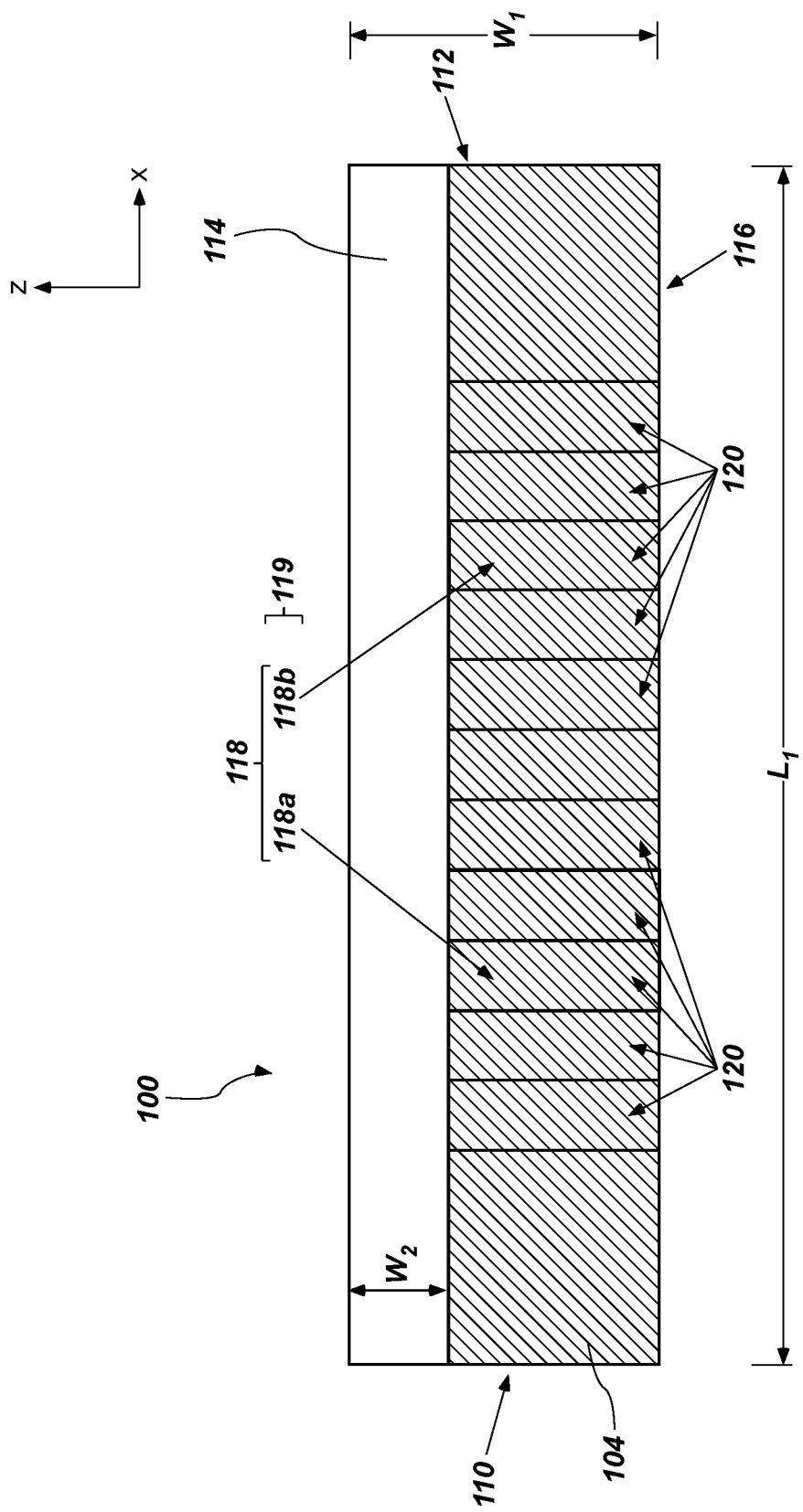

Referring to next to FIG. 3A, portions of the stack structure 102 (FIG. 2A) (e.g., portions of one of more of the tiers 108) remaining uncovered by the masking structure 114 may be subjected to at least one material removal process (e.g., one or more of a trimming process and a chopping process) to form a secondary stack structure 116. The secondary stack structure 116 may include one or more staircase structures 118 each independently formed of and including one or more steps 120. The steps 120 of the one or more staircase structures 118 may be at least partially defined by exposed portions of one or more of the tiers 108 remaining following the at least one material removal process. FIG. 3B is a top-down view of the semiconductor device structure 100 at the processing stage depicted in FIG. 3A.

The secondary stack structure 116 may include a single (e.g., only one) staircase structure 118, or may include multiple (e.g., more than one) staircase structures 118. In some embodiments, the secondary stack structure 116 includes multiple staircase structures 118. By way of non-limiting example, as shown in FIG. 3A, the secondary stack structure 116 may include at least one stadium structure 119 including a first staircase structure 118a exhibiting a generally negative slope, and a second staircase structure 118b opposing the first staircase structure 118a and exhibiting a generally positive slope. The second staircase structure 118b may mirror the first staircase structure 118a. As used herein, the term "mirror" means and includes that at least two structures are mirror images of one another. For example, the first staircase structure 118a and the second staircase structure 118b may exhibit the substantially same size and substantially the same shape, but the first staircase structure 118a may outwardly extend in a direction (e.g., the negative X-direction) that opposes a direction (e.g., the positive X-direction) in which the second staircase structure 118b outwardly extends. In some embodiments, the first staircase structure 118a and the second staircase structure 118b are substantially similar to one another. Multiple staircase structures 118 (e.g., the first staircase structure 118a and the second staircase structure 118b) may facilitate redundant and/or alternative means of connecting to one or more of the tiers 108 following subsequent processing of the semiconductor device structure 100, as described in further detail below.

In additional embodiments, the secondary stack structure 116 may exhibit one or more of a different number and different configuration of the staircase structures 118. As a non-limiting example, the secondary stack structure 116 may include multiple (e.g., more than one) staircase structures 118 exhibiting one or more generally negative slopes extending in parallel with one another in the X-direction, may include multiple staircase structures 118 exhibiting one or more generally positive slopes extending in parallel with one another in the X-direction, and/or may include multiple staircase structures 118 extending in parallel with one another in the X-direction wherein at least one of the multiple staircase structures 118 exhibits a generally negative slope and at least one other of the multiple staircase structures 118 exhibits a generally positive slope. In such embodiments, the multiple staircase structures 118 may be directly adjacent one another in the Y-direction, and/or may be separated (e.g., spaced apart) from one another in the Y-direction. As another non-limiting example, the secondary stack structure 116 may include multiple staircase structures 118 exhibiting one or more generally negative slopes extending in series with one another in the X-direction, and/or may include multiple staircase structures 118 exhibiting one or more generally positive slopes extending in series with one another in the X-direction. In such embodiments, the multiple staircase structures 118 may be directly adjacent one another in the X-direction, and/or may be separated from one another in the X-direction. As a further non-limiting example, the secondary stack structure 116 may include one or more staircase structures 118 exhibiting one or more generally negative slopes (e.g., the first staircase structure 118a) but not one or more staircase structures 118 exhibiting one or more generally positive slopes (e.g., the second staircase structure 118b may be omitted). As an additional non-limiting example, the secondary stack structure 116 may include may include one or more staircase structures 118 exhibiting one or more generally positive slopes (e.g., the second staircase structure 118b) but not one or more staircase structures 118 exhibiting one or more generally negative slopes (e.g., the first staircase structure 118a may be omitted). As a yet additional non-limiting example, the secondary stack structure 116 may include multiple stadium structures 119 extending parallel to one another in the X-direction, and/or may include multiple stadium structures 119 extending series with one another in the X-direction. In such embodiments, the multiple stadium structures 119 may be directly adjacent one another (e.g., in the Y-direction and/or in the X-direction), and/or may be separated from one another (e.g., in the Y-direction and/or in the X-direction).

In embodiments wherein the secondary stack structure 116 includes multiple staircase structures 118 (e.g., multiple stadium structures 119), each of the multiple staircase structures 118 may exhibit substantially the same geometric configuration (e.g., substantially the same shape, and substantially the same dimensions), or at least one of the multiple staircase structures 118 may exhibit a different geometric configuration (e.g., a different shape, and/or at least one different dimension) than at least one other of the multiple staircase structures 118. In addition, if the secondary stack structure 116 includes multiple staircase structures 118 (e.g., multiple stadium structures 119), each of the multiple staircase structures 118 may exhibit substantially the same longitudinal position (e.g., in the Z-direction) within the secondary stack structure 116, or at least one of the multiple staircase structures 118 may exhibit a different longitudinal position within the secondary stack structure 116 than at least one other of the multiple staircase structures 118.

Each of the staircase structures 118 included in the secondary stack structure 116 may independently include a desired number of steps 120. The number of steps 120 included in one or more of the staircase structures 118 may be substantially the same as (e.g., equal to) or may be different than (e.g., less than, or greater than) the number of tiers 108 in the secondary stack structure 116. In some embodiments, the number of steps 120 included in each of the staircase structures 118 is less than the number of tiers 108 in the secondary stack structure 116. As a non-limiting example, as shown in FIG. 3B, each of the staircase structures 118 may include (5) steps 120 at least partially defined by ends of a portion (e.g., tiers 108*b* through 108*f*) of the seven (7) tiers 108 (e.g., tiers 108*a* through 108*g*) of the secondary stack structure 116. In additional embodiments, one or more of the staircase structures 118 may include a different number of steps 120 (e.g., less than five (5) steps 120, greater than five (5) steps 120). By way of non-limiting example, if the secondary stack structure 116 includes seven (7) tiers 108, at least one of the staircase structures 118 may include three (3) steps 120 at least partially defined by ends of a relatively lower group of the tiers 108 (e.g., tier 108*d* through tier 108*f*), and at least one other of the staircase structures 118 may include two (2) steps 120 at least partially defined by ends of a relatively higher group of the tiers 108 (e.g., tier 108*b* and tier 108*c*).

The dimensions of each of the steps 120 may independently be tailored to desired dimensions and positions of one or more structures (e.g., conductive contact structures) and/or one or more openings (e.g., recesses) to be formed in, on, over, and/or adjacent to the steps 120 during subsequent processing of the semiconductor device structure 100, as described in further detail below. In some embodiments, each of the steps 120 exhibits substantially the same dimensions (e.g., substantially the same width, substantially the same length, and substantially the same height) as each other of the steps 120. In additional embodiments, at least one of the steps 120 exhibits different dimensions (e.g., one or more of a different width, a different length, and a different height) than at least one other of the steps 120.

The staircase structures 118 may be formed using conventional processes (e.g., conventional photolithography processes, conventional material removal processes) and conventional processing equipment, which are not described in detail herein. By way of non-limiting example, a photoresist structure may be formed on or over at least uncovered portions of the stack structure 102 (FIGS. 2A and 2B), the photoresist structure may be photolithographically processed (e.g., photoexposed and developed) to remove at least one width thereof, one or more of the tiers 108 may be etched (e.g., anisotropically etched, such as anisotropically dry etched) using the masking structure 114 and remaining portions of the photoresist structure as etching masks, the photoresist structure may be subjected to additional photolithographic processing to remove at least one additional width thereof, at least another group of the tiers 108 (e.g., previously etched tiers 108 and one or more additional tiers 108) may be etched using the masking structure 114 and newly remaining portions of the photoresist structure as etching masks, and so on, until the secondary stack structure 116 including the one or more staircase structures 118 is formed. If the secondary stack structure 116 includes multiple staircase structures 118 (e.g., staircase structures 118 extending in parallel in the X-direction, and/or staircase structures 118 extending in series in the X-direction), such as multiple stadium structures 119 (e.g., multiple stadium structures 119 extending in parallel in the X-direction, and/or multiple stadium structures 119 extending in series in the X-direction), different staircase structures 118 may be formed using a single material removal process, or may be formed using a multiple material removal processes. For example, a first staircase structure 118 may be formed using a first material removal process similar to that described above, and then a second staircase structure 118 may be formed using a second material removal process similar to that described above. A region of the stack structure 102 (FIGS. 2A and 2B) corresponding to a desired position of the second staircase structure 118 may, for example, be at least partially covered with a masking material (e.g., a photoresist material, a hard mask material) during the first material removal process, and the masking material may be at least partially removed before and/or during the second first material removal process.

Figure 4A:
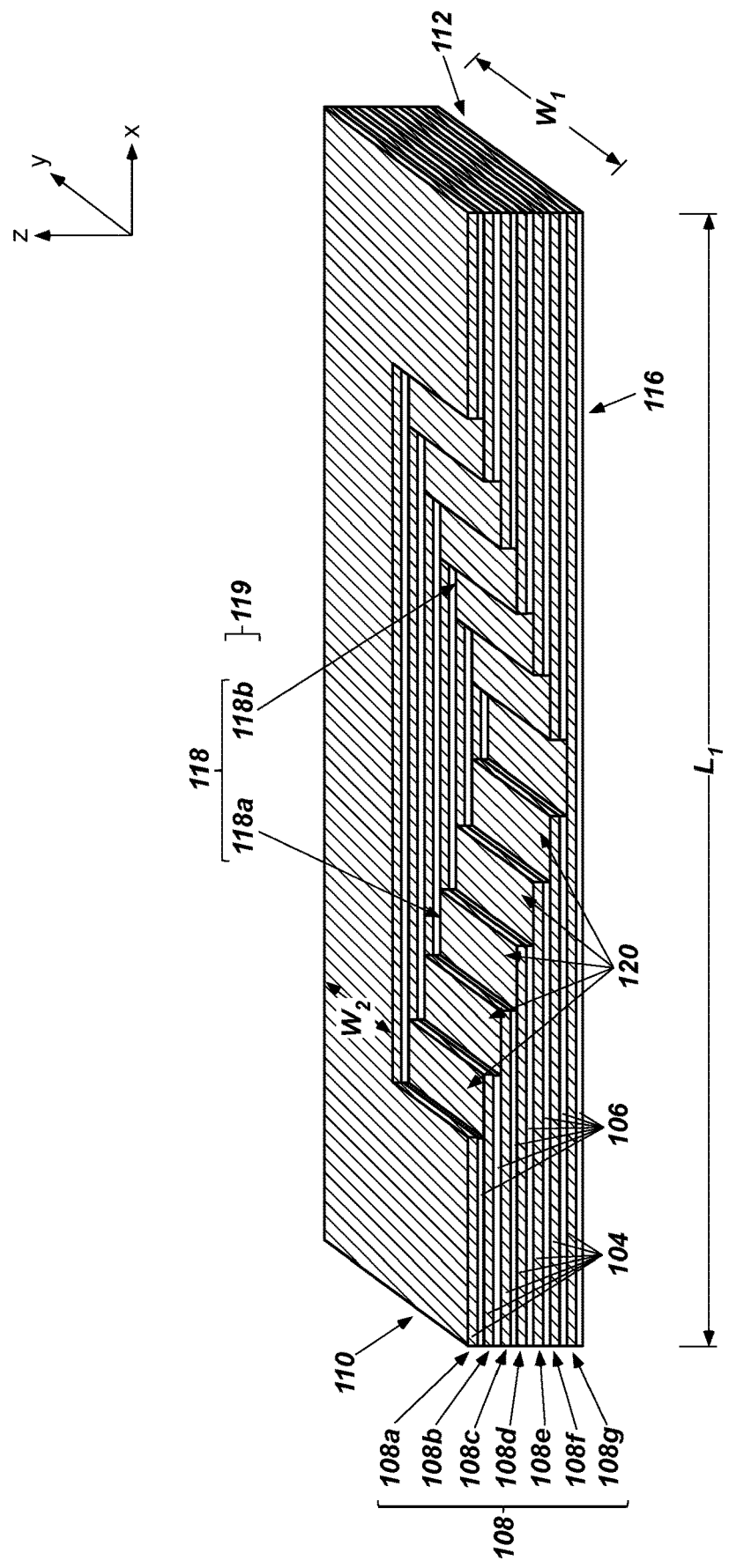
Figure 4B:
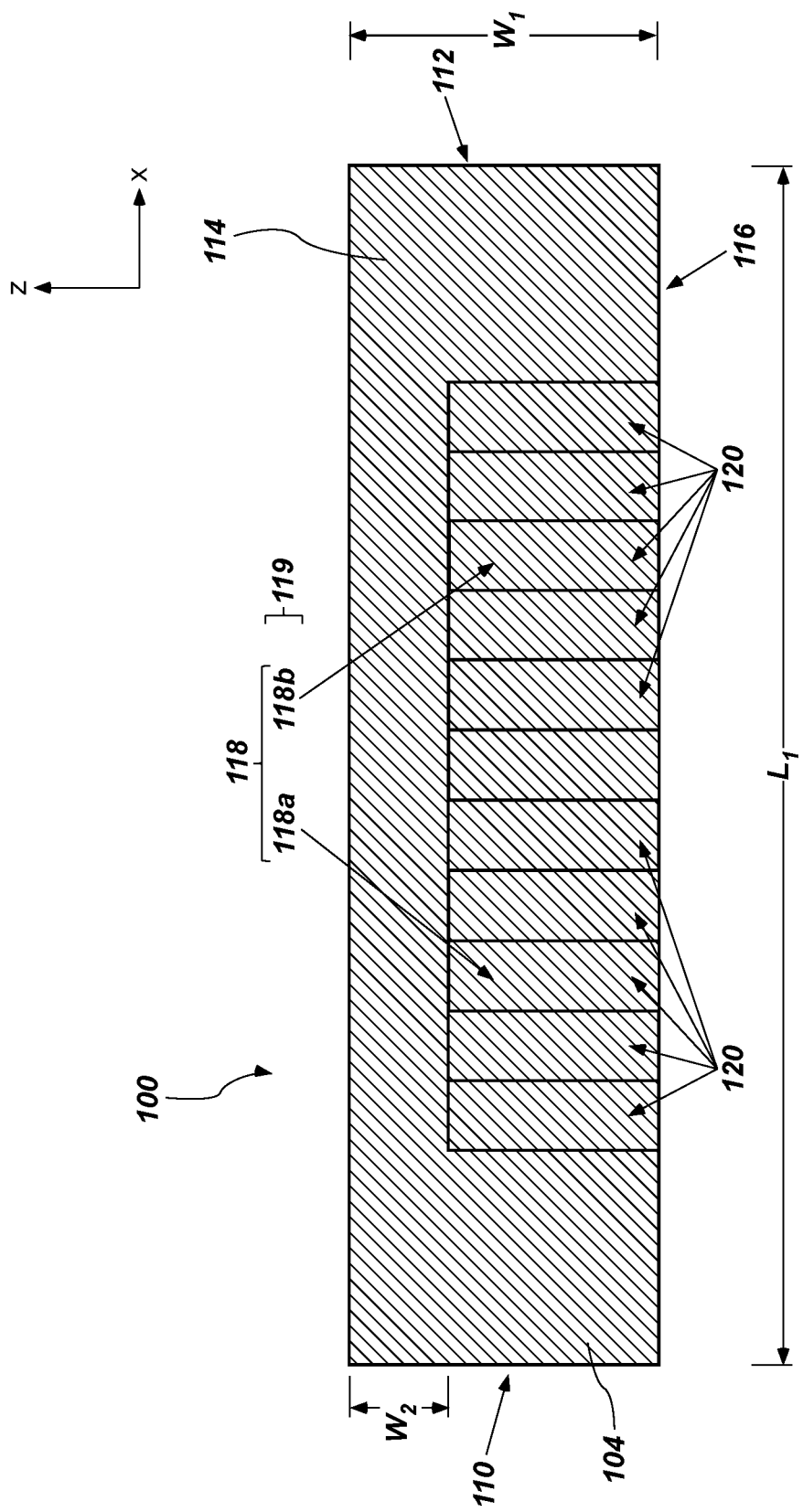

Referring next to FIG. 4A, the masking structure 114 (FIGS. 3A and 3B) may be removed. The masking structure 114 may be selectively removed relative to the secondary stack structure 116. The removal of the masking structure 114 may expose portions of the secondary stack structure 116 previously covered by the masking structure 114, such as portions of the secondary stack structure 116 laterally adjacent (e.g., in the Y-direction) the staircase structures 118 (e.g., laterally adjacent the stadium structure 119 including the first staircase structure 118*a* and the second staircase structure 118*b*). The masking structure 114 may be removed using one or more conventional material removal processes, which are not described in detail herein. By way of non-limiting example, the masking structure 114 may be selectively removed through at least one conventional etching process (e.g., a conventional wet etching process, a conventional dry etching process). FIG. 4B is a top-down view of the semiconductor device structure 100 at the processing stage depicted in FIG. 4A.

Figure 5A:
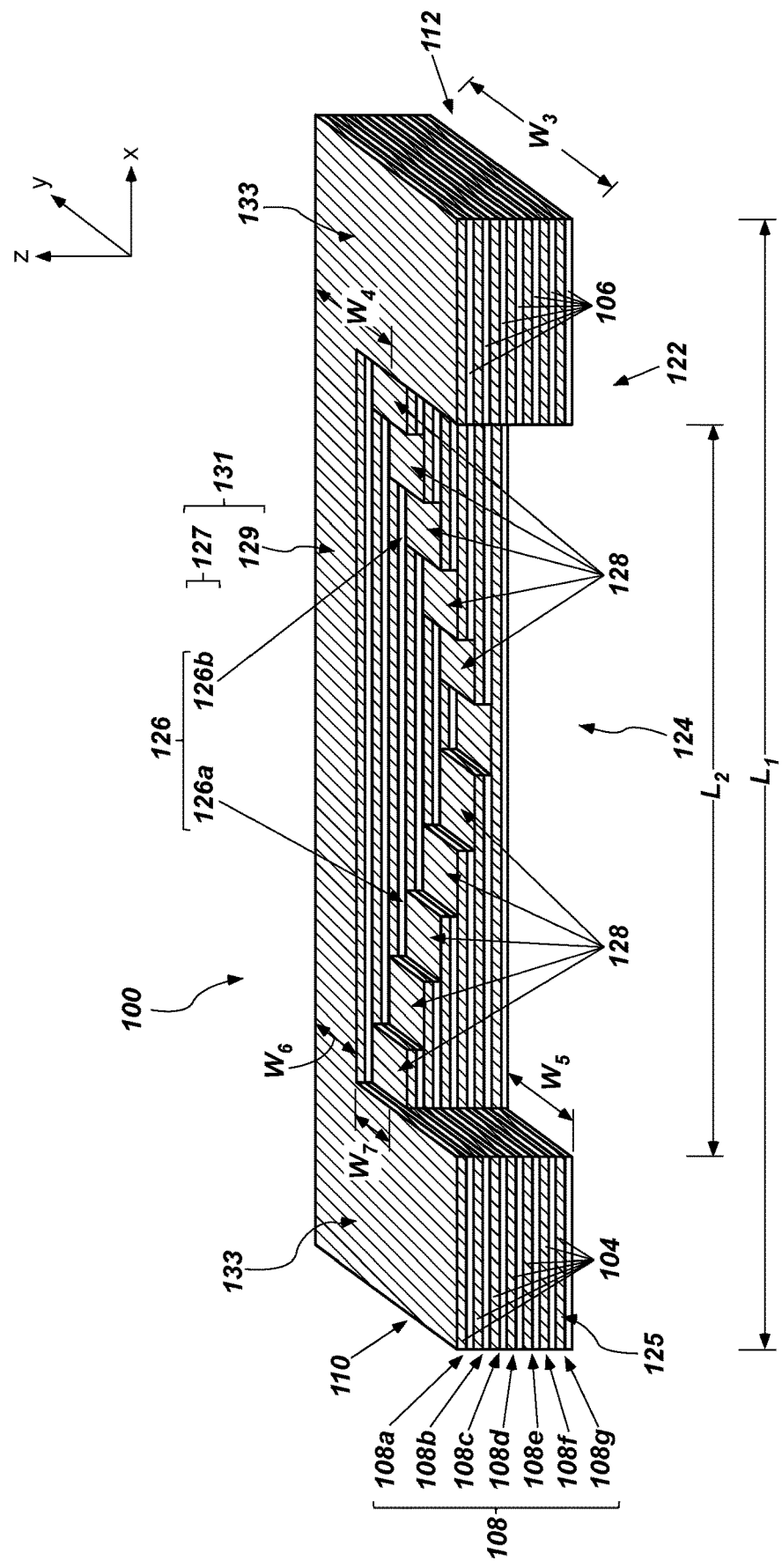
Figure 5B:
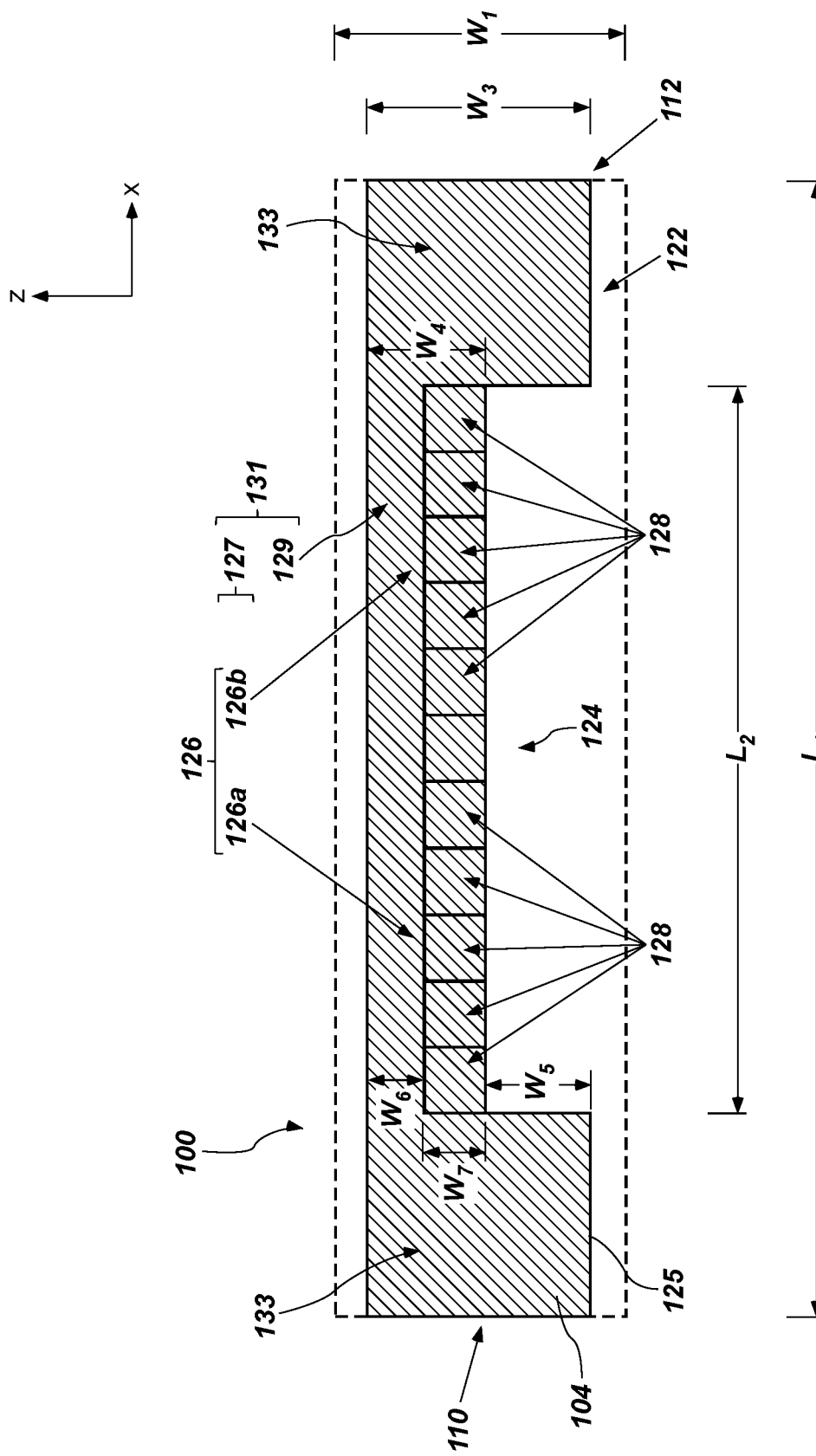

Referring next to FIG. 5A, portions of the secondary stack structure 116 (FIGS. 4A and 4B) may be removed to form a tertiary stack structure 122 exhibiting at least one opening 124 therein. The opening 124, which may also be characterized as a recess, may longitudinally extend through (e.g., completely through) the tertiary stack structure 122, and may laterally extend into and across the tertiary stack structure 122 to form additional staircase structures 126 exhibiting relatively smaller widths than the staircase structures 118 (FIGS. 4A and 4B) of the secondary stack structure 116. The opening 124 may be positioned laterally outward (e.g., in the Y-direction) of the additional staircase structures 126 and may continuously laterally extend (e.g., in the X-direction) across entire lengths of the additional staircase structures 126. FIG. 5B is a top-down view of the semiconductor device structure 100 at the processing stage depicted in FIG. 5A, including dashed lines showing the lateral dimensions of the secondary stack structure 116 (FIG. 4A).

As shown in FIG. 5B, the tertiary stack structure 122 may exhibit substantially the same length $L_1$ as the secondary stack structure 116 (FIGS. 4A and 4B), but may exhibit smaller widths than the width $W_1$ of the secondary stack structure 116. Opposing end sections 133 of the tertiary stack structure 122 laterally outward of the opening 124 in the X-direction and proximate the first end 110 and the second, opposing end 112 of the tertiary stack structure 122 may exhibit a first width $W_3$ smaller than the width $W_1$ of the of the secondary stack structure 116. In addition, an interior section 131 laterally intervening between the opposing end sections 133 in the X-direction and laterally inward of (e.g., laterally adjacent) the opening 124 in the Y-direction may exhibit a second with $W_4$ smaller than the first width $W_3$.

The interior section 131 of the tertiary stack structure 122 may comprise the additional staircase structures 126 and an elongate middle region 129 laterally adjacent the additional staircase structures 126 in the Y-direction. The elongate middle region 129 may exhibit a width $W_6$ in the Y-direction, and may continuously laterally extend from and between the opposing end sections 133 of the tertiary stack structure 122 in the X-direction. The additional staircase structures 126 may include steps 128, and may laterally intervene between the elongate middle region 129 and the opening 124 in the Y-direction. The additional staircase structures 126 may be substantially similar to the staircase structures 118 (FIGS. 4A and 4B) of the secondary stack structure 116 (FIGS. 4A and 4B), except that a width $W_7$ of at least some of the additional staircase structures 126 may be less than the width of the staircase structures 118 of the secondary stack structure 116. For example, as shown in FIGS. 5A and 5B, the tertiary stack structure 122 may include at least one additional stadium structure 127 including a first additional staircase structure 126a exhibiting a generally negative slope, and a second additional staircase structure 126b opposing the first additional staircase structure 126a and exhibiting a generally positive slope. The second additional staircase structure 126b may mirror the first additional staircase structure 126a. The additional stadium structure 127 may be substantially similar to the stadium structure 119 (FIGS. 4A and 4B) of the secondary stack structure 116 (e.g., lengths, quantities, and arrangements of the steps 128 of the additional stadium structure 127 may be substantially similar to the lengths, quantities, and arrangements of the steps 120 of the stadium structure 119), except that the width $W_7$ of the additional stadium structure 127 may be less than the width of the stadium structure 119 of the secondary stack structure 116. The width $W_4$ of the interior section 131 may include the width $W_6$ of the elongate middle region 129 and the width $W_7$ of the additional staircase structures 126.

With continued reference to FIG. 5A, the dimensions (e.g., length, width, height) and lateral position of the opening 124 may be selected to provide desired dimensions (e.g., the width $W_7$) to the additional staircase structures 126, to provide desired continuity to the conductive structures 104 of the tiers 108 of the tertiary stack structure 122, and to provide sufficient space to extend routing structures through the opening 124, as described in further detail below. The opening 124 may extend into an outer lateral surface 125 of the tertiary stack structure 122, may continuously extend across and between the additional staircase structures 126 of the tertiary stack structure 122, and may extend completely through the tertiary stack structure 122. By way of non-limiting example, as shown in FIG. 5A, the opening 124 may inwardly laterally extend a width $W_5$ in the Y-direction into the each of the tiers 108 of the tertiary stack structure 122 from the outer lateral surface 125 of the tertiary stack structure 122, may continuously laterally extend in the X-direction across an entire length $L_2$ of the additional stadium structure 127 of the tertiary stack structure 122, and may extend in the Z-direction completely through each of the tiers 108 of the tertiary stack structure 122. The opening 124 may be laterally confined between the opposing end sections 133 of the tertiary stack structure 122 in the X-direction, and may laterally extend in the X-direction from a top (e.g., a laterally inward end of tier 108a) of the first additional staircase structure 126a of the additional stadium structure 127 to a top (e.g., an opposing laterally inward end of tier 108a) of the second additional staircase structure 126b of the additional stadium structure 127.

As shown in FIG. 5A, the conductive structures 104 of the tiers 108 of the tertiary stack structure 122 may individually inwardly laterally extend completely across the opposing end sections 133 of the tertiary stack structure 122 and the elongate middle region 129 of the interior section 131 of the tertiary stack structure 122, and may also inwardly laterally extend to the steps 128 of the additional staircase structures 126 of the interior section 131 of the tertiary stack structure 122. For each of the conductive structures 104, portions thereof laterally extending to and at least partially defining the additional staircase structures 126 may be integral and continuous with additional portions thereof laterally extending completely across the opposing end sections 133 of the tertiary stack structure 122 and the elongate middle region 129 of the interior section 131 of the tertiary stack structure 122. Accordingly, the conductive structures 104 of the tertiary stack structure 122 may individually form continuous conductive paths extending from the first end 110 of the tertiary stack structure 122 to the second, opposing end 112 of the tertiary stack structure 122.

Each of the conductive structures 104 of the tertiary stack structure 122 may exhibit a different shape and at least one different dimension than each other of the conductive structures 104, or at least one of the conductive structures 104 may exhibit one or more of substantially the same shape and substantially the same dimensions as at least one other of the conductive structures 104. By way of non-limiting example, as shown in FIG. 5A, the conductive structures 104 of different tiers 108 may exhibit different shapes and different dimensions (e.g., different shapes and different dimensions associated with differences in the steps 128 of the additional staircase structures 126) than one another. In additional embodiments, conductive structures 104 of two or more different tiers 108 may exhibit substantially the same shapes and substantially the same dimensions as one another.

The tertiary stack structure 122 (including the opposing end sections 133 and the interior section 131 thereof) may be formed from the secondary stack structure 116 (FIGS. 4A and 4B) using one or more conventional material removal processes, which are not described in detail herein. For example, the secondary stack structure 116 may be subjected to at least one etching process (e.g., at least one dry etching process, such as at least one of an RIE process, a deep RIE process, a plasma etching process, a reactive ion beam etching process, and a chemically assisted ion beam etching process; at least one wet etching process, such as at least one of a hydrofluoric acid etching process, a buffered hydrofluoric acid etching process, and a buffered oxide etching process) to remove portions thereof and form the tertiary stack structure 122.

Thus, in accordance with embodiments of the disclosure, a method of forming a semiconductor device structure comprises forming a stack structure comprising stacked tiers each comprising a conductive structure and an insulating structure longitudinally adjacent the conductive structure. A masking structure is formed over a portion of the stack structure. Portions of the stacked tiers of the stack structure not covered by the masking structure are removed to form a secondary stack structure comprising at least one staircase structure having steps comprising lateral ends of the stacked tiers. The masking structure is removed after forming the secondary stack structure. Portions of the secondary stack structure are removed to form a tertiary stack structure comprising opposing end sections exhibiting a first width and an interior section laterally intervening between the opposing end sections and exhibiting a second width smaller than the first width. The interior section comprises at least one additional staircase structure exhibiting a smaller width than the staircase structure of the secondary stack structure and an elongate middle region directly laterally adjacent a first side of the at least one additional staircase structure.

Furthermore, in accordance with additional embodiments of the disclosure, a semiconductor device structure comprises stacked tiers each comprising a conductive structure and an insulating structure longitudinally adjacent the at least one conductive structure, at least one staircase structure having steps comprising lateral ends of the stacked tiers, and an opening laterally adjacent a first side of the at least one staircase structure and extending through the stacked tiers and continuously across an entire length of the at least one staircase structure. Conductive structures of the stacked tiers laterally extend from the steps of the at least one staircase structure completely across a second side of the at least one staircase structure opposing the first side to form continuous conductive paths laterally extending completely across the stacked tiers.

While FIGS. 3A through 5B depict the opening 124 (FIGS. 5A and 5B) and the additional staircase structures 126 (FIGS. 5A and 5B) as being formed subsequent to the formation of the staircase structures 118 (FIGS. 3A and 3B), in additional embodiments, the opening 124 and the additional staircase structures 126 may be formed without previously forming the staircase structures 118 (FIGS. 3A and 3B). By way of non-limiting example, upon forming the masking structure 114 (FIG. 2A) over the stack structure 102 (FIG. 2A), the stack structure 102 may be subjected to at least one material removal process to form the opening 124 therein, and then the resulting secondary (e.g., modified) stack structure may be subjected to at least one additional material removal process to form the tertiary stack structure 122 including the additional staircase structures 126 laterally inward of (e.g., adjacent) the opening 124 in the Y-direction. The material removal process may, for example, include selectively covering one or more exposed portions (e.g., exposed peripheral portions) of the stack structure 102 with at least one masking material (e.g., a photoresist material, a hard mask material) and then removing (e.g., etching, such as anisotropically dry etching) one or more remaining exposed portions (e.g., an exposed central portion) of the stack structure 102 to form the modified stack structure including the opening 124 therein. The additional material removal process may, for example, include removing one or more portions of the masking material and/or forming an additional masking material on or over one or more exposed portions of the secondary stack structure, removing (e.g., etching, such as anisotropically dry etching) one or more of the tiers 108 using the masking structure 114 and one or more of the remaining masking material (if any) and the additional masking material (if any), removing portions of the remaining masking material (if any) and/or the additional masking material (if any), etching at least another group of the tiers 108 (e.g., previously etched tiers 108 and one or more additional tiers 108) using the masking structure 114 and newly remaining portions of the masking material (if any) and/or the remaining additional masking material (if any) as etching masks, and so on, until the tertiary stack structure 122 including the additional staircase structures 126 is formed.

Figure 5C:
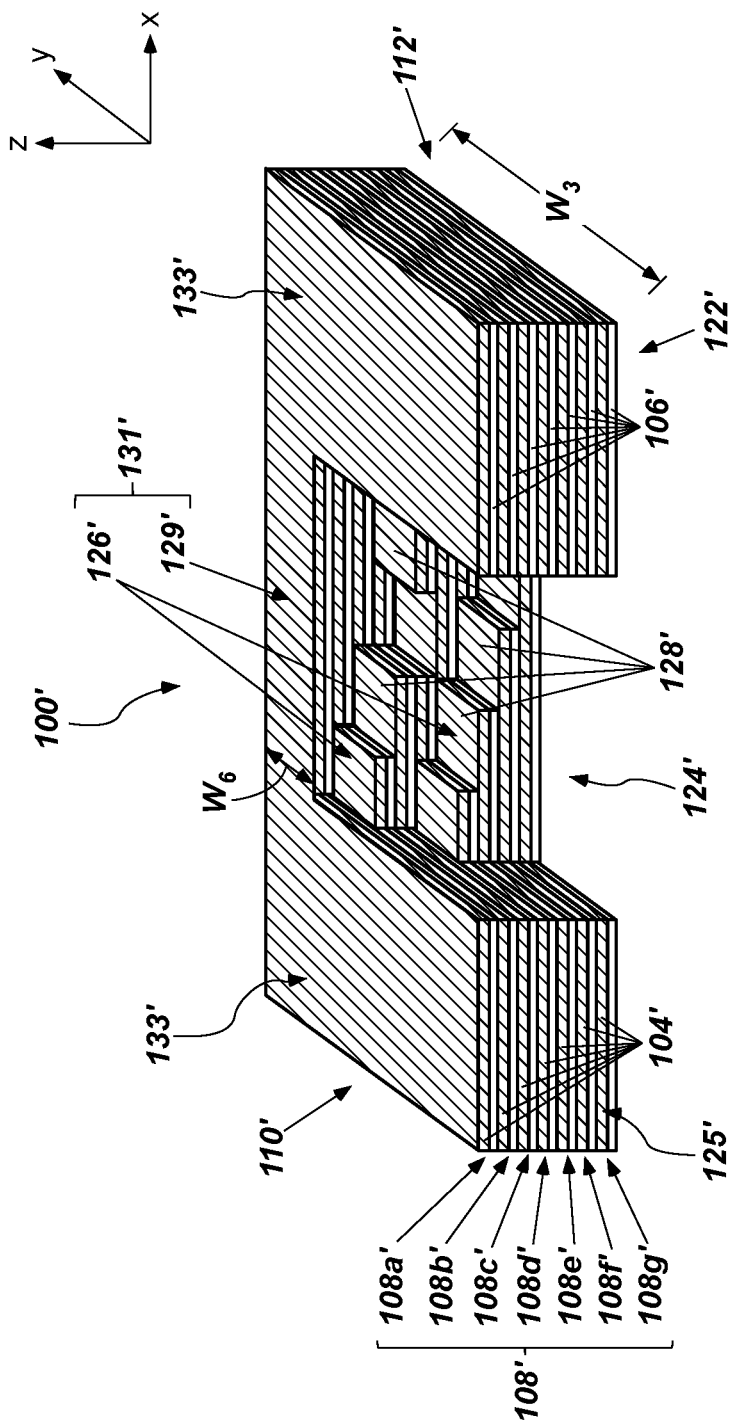
Figure 5D:
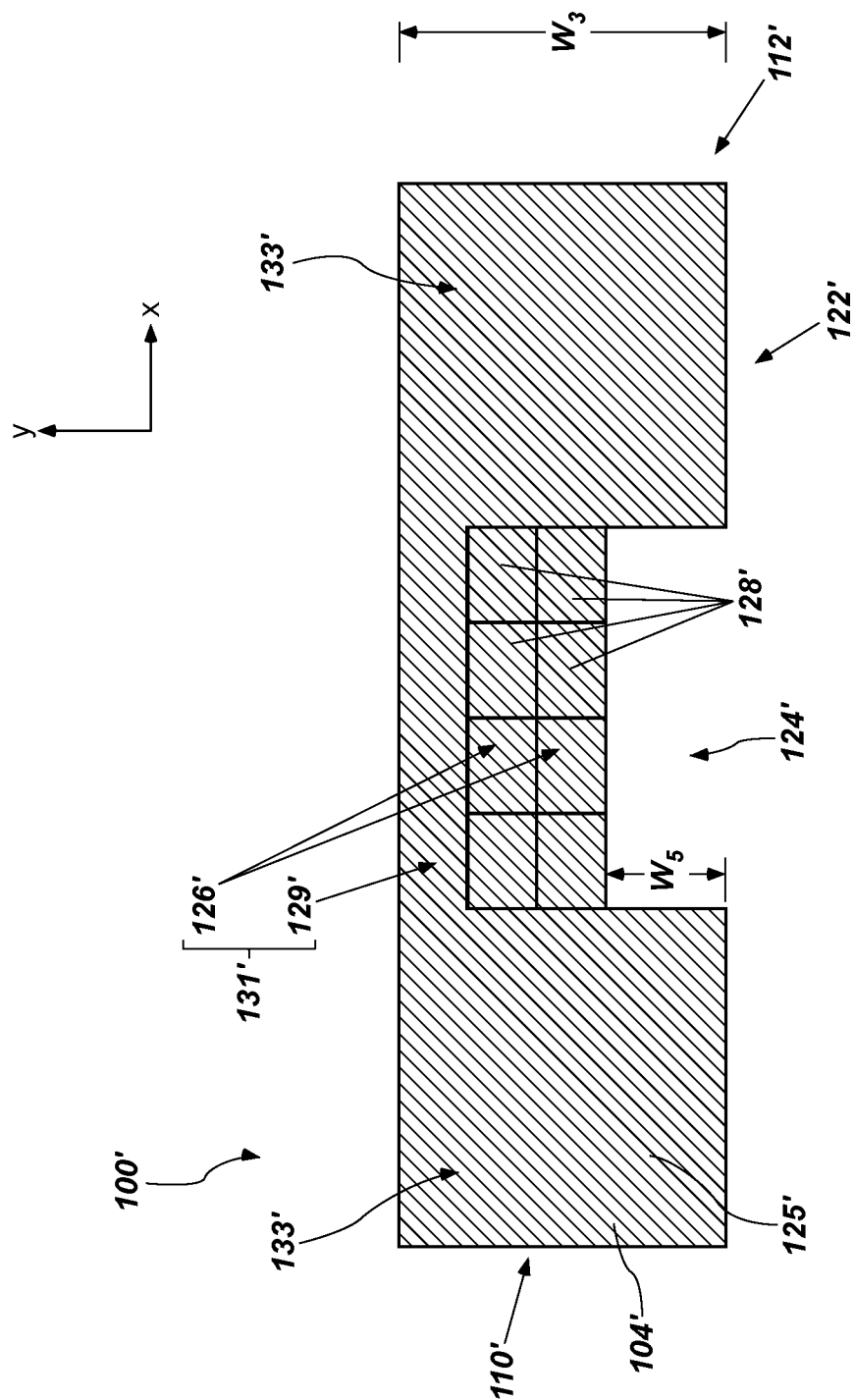

In addition, as previously described above, the tertiary stack structure 122 may be formed to exhibit a different configuration than that depicted in FIGS. 5A and 5B. By way of non-limiting example and referring to FIG. 5C, in additional embodiments, a semiconductor device structure 100' may include a tertiary stack structure 122' exhibiting a different configuration than that of the tertiary stack structure 122 of the semiconductor device structure 100 shown in FIGS. 5A and 5B. FIG. 5D is a top-down view of the semiconductor device structure 100' at the processing stage depicted in FIG. 5C. To avoid repetition, not all features shown in FIGS. 5C and 5D are described in detail herein. Rather, unless described otherwise below, features designated by a primed (') reference numeral (e.g., 104', 106', 108', 110', 112') corresponding to a reference numeral (e.g., 104, 106, 108, 110, 112) of a feature described previously in relation to one or more of FIGS. 1A through 5B will be understood to be substantially similar to the feature described previously.

As shown in FIG. 5C, the tertiary stack structure 122' may include opposing end sections 133' and each of an opening 124' and an interior section 131' laterally intervening between the opposing end sections 133' in the X-direction. The interior section 131' may be positioned laterally inward of (e.g., laterally adjacent) the opening 124' in the Y-direction. The interior section 131' may include additional staircase structures 126' exhibiting additional steps 128' laterally inward of (e.g., laterally adjacent) the opening 124' in the Y-direction, and an elongate middle region 129' laterally adjacent the additional staircase structures 126' in the Y-direction. As described in further detail below, the additional staircase structures 126' may exhibit different geometric configurations (e.g., different shapes, different dimensions) than the additional staircase structures 126 (FIG. 5A) of the tertiary stack structure 122 (FIG. 5A).

As depicted in FIG. 5C, the additional staircase structures 126' of the tertiary stack structure 122' may extend in parallel with one another in the X-direction. A first of the additional staircase structures 126' may be positioned laterally inward of (e.g., laterally adjacent) the opening 124' in the Y-direction, and a second of the additional staircase structures 126' may be positioned laterally between the first of the additional staircase structures 126' and the elongate middle region 129' in the Y-direction. In addition, the additional staircase structures 126' may exhibit different longitudinal positions (e.g., in the Z-direction) within the secondary tertiary stack structure 122'. For example, steps 128' of the first of the additional staircase structures 126' may be at least partially defined by ends of a relatively lower group of tiers 108', and steps 128' of the second of the additional staircase structures 126' may be at least partially defined by ends of a relatively higher group of the tiers 108'. Accordingly, the steps 128' of the first of the additional staircase structures 126' may define contact regions for conductive structures 104' of the relatively lower group of the tiers 108', and the steps 128' of the second of the additional staircase structures 126' may define contact regions for the conductive structures 104' of the relatively higher group of the tiers 108'. In further embodiments, the tertiary stack structure 122' may exhibit one or more of a different quantity and a different arrangement of the additional staircase structures 126'. For example, the tertiary stack structure 122' may include greater than two (2) additional staircase structures 126' extending in parallel with one another in the X-direction, and/or one or more of the additional staircase structures 126' may exhibit substantially the same longitudinal position (e.g., in the Z-direction) as one or more other of the additional staircase structures 126'.

The additional staircase structures 126' of the tertiary stack structure 122' may exhibit different geometric configurations than one another. For example, as shown in FIG. 5C, the first of the additional staircase structures 126' may exhibit a first shape extending in the X-direction, and the second of the additional staircase structures 126' may exhibit a second, different shape extending in the X-direction. The steps 128' of the first of the additional staircase structures 126' may be arranged in order such that steps 128' of the first of the additional staircase structures 126' directly laterally adjacent (e.g., in the X-direction) one another correspond to tiers 108' of the first of the additional staircase structures 126' directly longitudinally adjacent (e.g., in the Z-direction) one another. The steps 128' of the second of the additional staircase structures 126' may be arranged out of order such that at least some steps 128' of the second of the additional staircase structures 126' directly laterally adjacent (e.g., in the X-direction) one another correspond to tiers 108' of the second of the additional staircase structures 126' not directly longitudinally adjacent (e.g., in the Z-direction) one another. In additional embodiments, the additional staircase structures 126' exhibit different geometric configurations than one another, but at least one of the additional staircase structures 126' (e.g., the first of the additional staircase structures 126', the second of the additional staircase structures 126') exhibits a different geometric configuration (e.g., a different arrangement of the steps 128' thereof) than that depicted in FIG. 5C. In further embodiments, one or more of the additional staircase structures 126' exhibits substantially the same geometric configuration as one or more other of the additional staircase structures 126'.

The additional staircase structures 126' may be formed using conventional processes and conventional processing equipment, which are not described in detail herein. As a non-limiting example, a secondary stack structure including multiple staircase structures extending in parallel in the X-direction may be subjected to at least one material removal process (e.g., an etching process, such as an anisotropic dry etching process) to remove portions of a laterally outermost (e.g., in the Y-direction) staircase structure and form the tertiary stack structure 122' including the opening 124' and the additional staircase structures 126' laterally inward (e.g., in the Y-direction) of the opening 124'. As another non-limiting example, upon forming the masking structure 114 (FIG. 2A) over the stack structure 102 (FIG. 2A), the stack structure 102 may be subjected to at least one material removal process (e.g., an etching process, such as an anisotropic dry etching process) to form the opening 124' therein, and then the resulting secondary stack structure may be subjected to one or more additional material removal processes to form the tertiary stack structure 122' including the additional staircase structures 126' laterally inward of (e.g., in the Y-direction) the opening 124'. The material removal process may, for example, include selectively covering one or more exposed portions (e.g., exposed peripheral portions) of the stack structure 102 with at least one masking material (e.g., a photoresist material, a hard mask material), and then removing (e.g., etching, such as anisotropically dry etching) one or more remaining exposed portions (e.g., an exposed central portion) of the stack structure 102 to form the secondary stack structure including the opening 124' therein. The additional material removal processes may, for example, include removing one or more portions of the masking material and/or selectively forming an additional masking material on or over one or more exposed portions of the secondary stack structure, removing (e.g., etching, such as anisotropically dry etching) a portion of one or more of the tiers 108' using the masking structure 114 and one or more of the remaining masking material (if any) and the additional masking material (if any) to further modify the secondary stack structure, removing one or more portions of the remaining masking material (if any) and the additional masking material (if any) and/or selectively forming another masking material on or over one or more exposed portions of the further modified stack structure, removing portions of at least another group of the tiers 108' (e.g., previously etched tiers 108' and one or more additional tiers 108') using the masking structure 114 and one or more of the newly remaining masking material (if any), the remaining additional masking material (if any), and the another masking material (if any) as etching masks, and so on, until the tertiary stack structure 122' including the additional staircase structures 126' is formed.

Figure 6A:
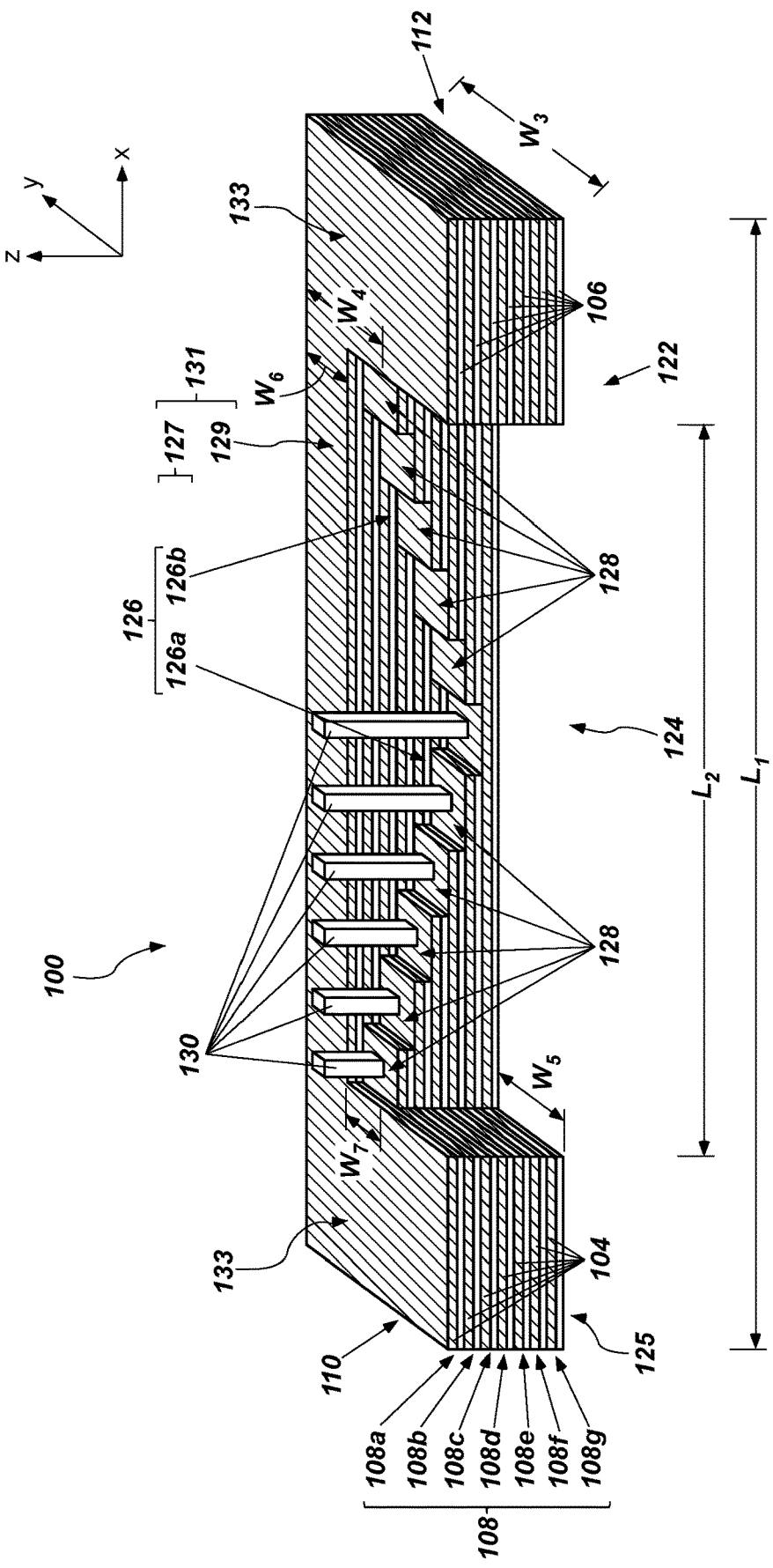
Figure 6B:
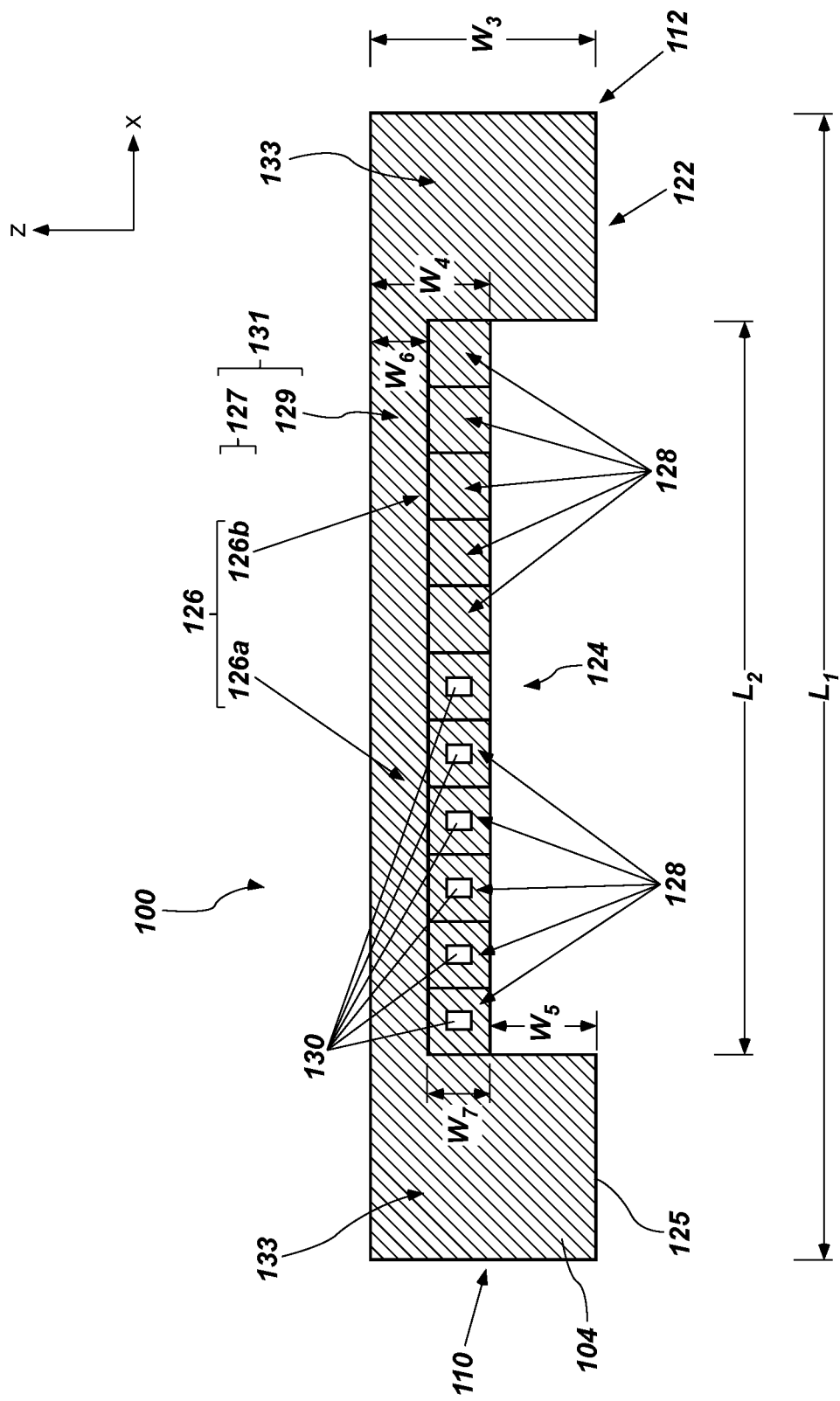

Referring next to FIG. 6A, which is a perspective view of the semiconductor device structure 100 depicted in FIG. 5A at a subsequent processing stage, contact structures 130 (e.g., plugs, vertical interconnections) may be formed on, over, and/or within one or more of the additional staircase structures 126 of the tertiary stack structure 122. The contact structures 130 may be coupled to the conductive structures 104 of the tiers 108 of the tertiary stack structure 122 at the steps 128 of the additional staircase structures 126. Each of the tiers 108 (e.g., each of the tiers 108a through 108g) may have one or more of the contact structures 130 coupled to the conductive structure 104 thereof, or less than all of the tiers 108 (e.g., less than all of the tiers 108a through 108g, such as only tiers 108b through 108g) may have one or more of the contact structures 130 coupled to the conductive structure 104 thereof. Each of the tiers 108 including one or more of the contact structures 130 coupled to the conductive structure 104 thereof may include a single (e.g., only one) contact structure 130 coupled to the conductive structure 104 thereof, or may include multiple (e.g., more than one) contact structures 130 coupled to the conductive structure 104 thereof. As a non-limiting example, the conductive structure 104 of one or more (e.g., each) of the tiers 108 may have at least one of the contact structures 130 coupled thereto at one or more of the steps 128 (e.g., one or more of the steps 128 of additional stadium structure 127, such as a step 128 of the first additional staircase structure 126a and/or a step 128 of the second additional staircase structure 126b) at least partially defined by the conductive structure 104. FIG. 6B is a top-down view of the semiconductor device structure 100 at the processing stage depicted in FIG. 6A.

The contact structures 130 may be formed on or over a single (e.g., only one) additional staircase structure 126 of the tertiary stack structure 122, or may be formed on or over multiple (e.g., more than one) additional staircase structures 126 of the tertiary stack structure 122. By way of non-limiting example, as shown in FIGS. 6A and 6B, within the additional stadium structure 127 of the tertiary stack structure 122, each of the steps 128 of the first additional staircase structure 126a may have a contact structure 130 formed thereon or thereover. In additional embodiments, within the additional stadium structure 127, each of the steps 128 of the second additional staircase structure 126b may have a contact structure 130 formed thereon or thereover. In further embodiments, at least a portion of the steps 128 of the first additional staircase structure 126a may each have a contact structure 130 formed thereon or thereover, and at least a portion of the steps 128 of the second additional staircase structure 126b may each have a contact structure 130 formed thereon or thereover. By way of non-limiting example, steps 128 of the first additional staircase structure 126a defined by ends of a relatively higher (e.g., in the Z-direction) group of the tiers 108 may have contact structures 130 formed thereon, and steps 128 of the second additional staircase structure 126b defined by ends of a relatively lower (e.g., in the Z-direction) group of the tiers 108 may also have contact structures 130 formed thereon, or vice versa.

Contact structures 130 formed on or over the same additional staircase structure 126 (e.g., one of the first additional staircase structure 126a and the second additional staircase structure 126b) may be substantially uniformly (e.g., evenly) spaced apart from one another, or may be non-uniformly (e.g., unevenly) spaced apart from one another. Contact structures 130 formed on or over the same additional staircase structure 126 may be formed to be generally centrally positioned (e.g., in at least the X-direction) on or over the steps 128 associated therewith. Accordingly, distances between adjacent contact structures 130 located on or over the same additional staircase structure 126 may vary in accordance with variance in the lengths (e.g., in the X-direction) of the adjacent steps 128 associated with the adjacent contact structures 130. A pitch between adjacent contact structures 130 located on or over the same additional staircase structure 126 may be substantially similar to a pitch between the adjacent steps 128 associated with (e.g., coupled to) the adjacent contact structures 130. In addition, contact structures 130 formed on or over the same additional staircase structure 126 may be substantially aligned with one another (e.g., not offset from one another in the Y-direction), or may be at least partially non-aligned with one another (e.g., offset from one another in the Y-direction).

The contact structures 130 may be formed of and include at least one conductive material, such as a metal (e.g., tungsten, titanium, molybdenum, niobium, vanadium, hafnium, tantalum, chromium, zirconium, iron, ruthenium, osmium, cobalt, rhodium, iridium, nickel, palladium, platinum, copper, silver, gold, aluminum), a metal alloy (e.g., a cobalt-based alloy, an iron-based alloy, a nickel-based alloy, an iron- and nickel-based alloy, a cobalt- and nickel-based alloy, an iron- and cobalt-based alloy, a cobalt- and nickel- and iron-based alloy, an aluminum-based alloy, a copper-based alloy, a magnesium-based alloy, a titanium-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped silicon, conductively-doped germanium, conductively-doped silicon germanium), or combinations thereof. Each of the contact structures 130 may have substantially the same material composition, or at least one of the contact structures 130 may have a different material composition than at least one other of the contact structures 130.

The contact structures 130 may be formed on, over, and/or within one or more of the additional staircase structures 126 of the tertiary stack structure 122 using conventional processes (e.g., conventional deposition processes, conventional photolithography processes, conventional material removal processes) and conventional processing equipment, which are not described in detail herein.

Figure 7A:
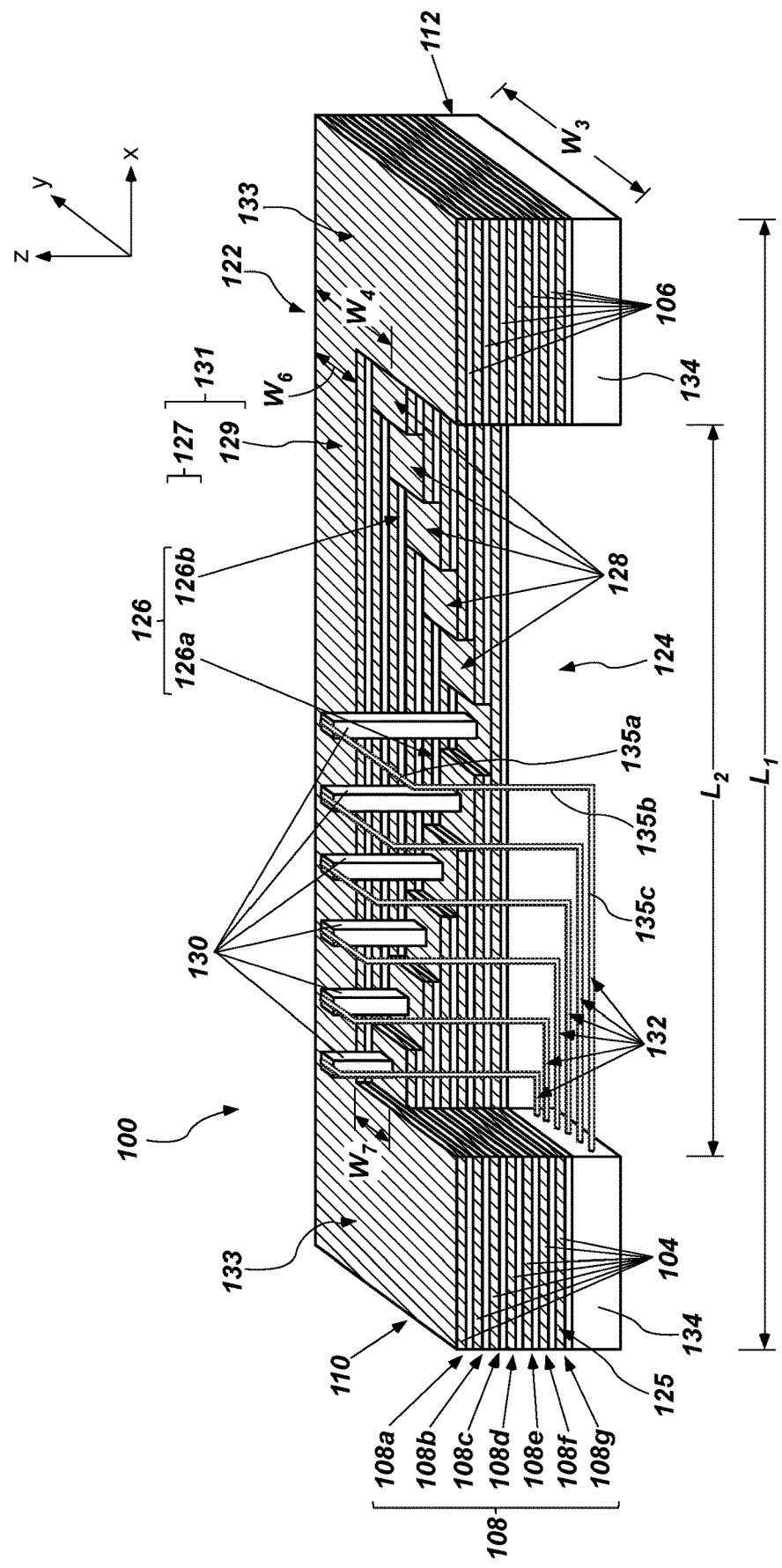
Figure 7B:
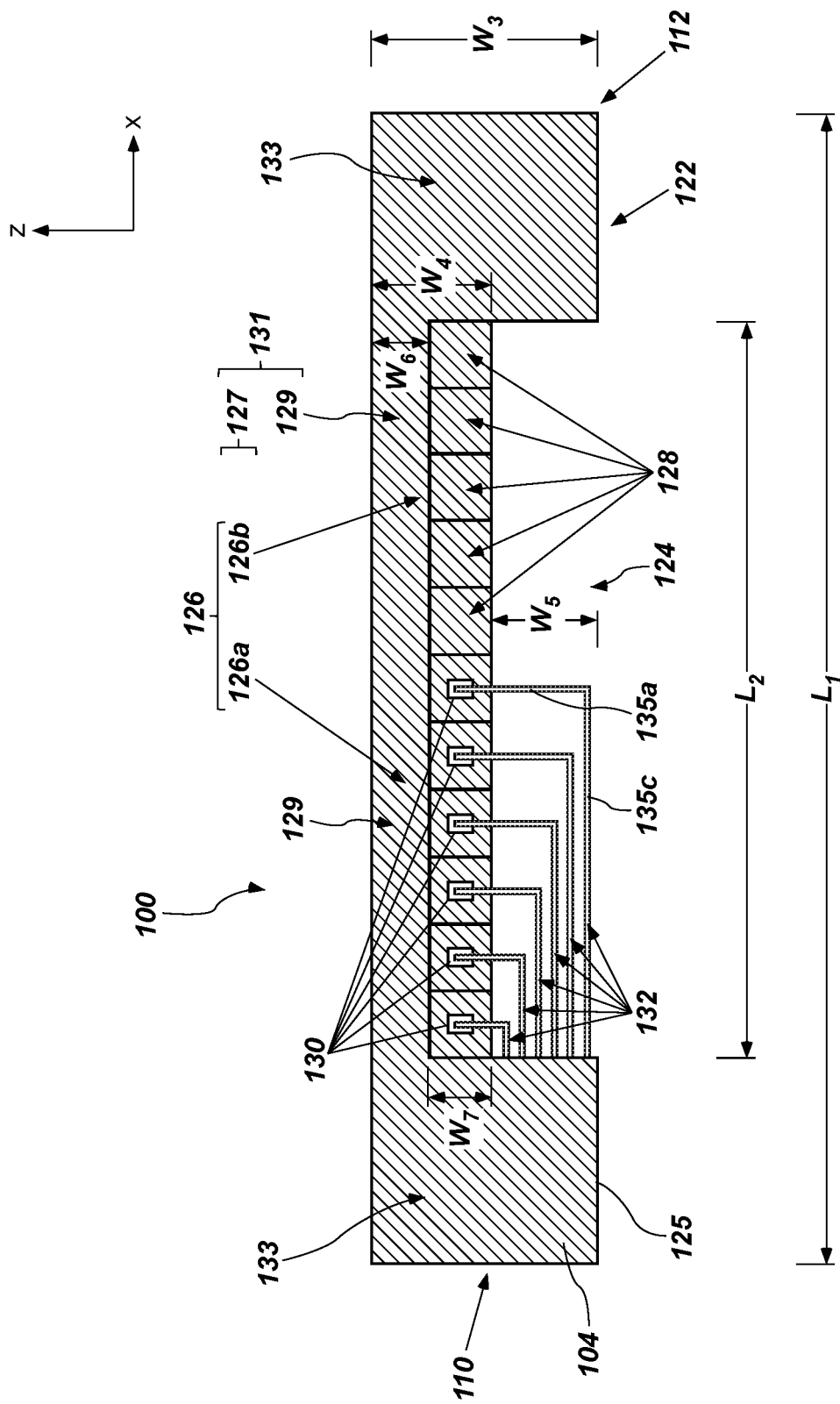

Referring next to FIG. 7A, routing structures 132 may be coupled (e.g., attached, connected) to the contact structures 130 and at least one string driver device 134. The string driver device 134 may be formed of and include a plurality of switching devices (e.g., transistors, such as FETs). Suitable designs and configurations for the at least one string driver device 134 are well known in the art, and are therefore not described in detail herein. The string driver device 134 may, for example, underlie one or more sections (e.g., one or more of the opposing end sections 133, the interior section 131, or combinations thereof) of the tertiary stack structure 122. The combination of the contact structures 130 and the routing structures 132 may electrically connect the conductive structures 104 of one or more of the tiers 108 to the string driver device 134, facilitating application of voltages to the conductive structures 104 using the string driver device 134. In addition, the continuous conductive paths across the tertiary stack structure 122 (e.g., from the first end 110 to the second, opposing end 112) provided by the configurations of the conductive structures 104 may permit an individual (e.g., single) switching device (e.g., an individual transistor, such as an individual FET) of the string driver device 134 to drive voltages completely across (e.g., from the first end 110 to the second, opposing end 112) and/or in opposing directions across (e.g., toward the first end 110 and toward the second, opposing end 112) an individual tier 108 electrically connected thereto. Accordingly, the configuration of the semiconductor device structure 100 (including the configurations of the tertiary stack structure 122, the contact structures 130, the routing structures 132, and the string driver devices 134 relative to one another) may permit an individual switching device of an individual string driver device 134 to simultaneously drive voltages to different (e.g., separate, distinct) semiconductor device components (e.g., different memory cell arrays) coupled to an individual tier 108 of the tertiary stack structure 122 at opposing ends (e.g., the first end 110, and the second, opposing end 112) of the tertiary stack structure 122. FIG. 7B is a top-down view of the semiconductor device structure 100 at the processing stage depicted in FIG. 7A.

The routing structures 132 may extend from the contact structures 130, through the opening 124, and to one or more of the string driver devices 134. By way of non-limiting example, as shown in FIG. 7A, each of the routing structures 132 may independently include a first portion 135a laterally extending from a contact structure 130 associated therewith to a location above the opening 124; a second portion 135b longitudinally extending from the first portion 135*a*, through the opening 124, and to a location below the opening 124; and a third portion 135*c* laterally extending from the second portion 135*b* to a string driver device 134.

The first portion 135*a* of each of the routing structures 132 may laterally extend in a direction perpendicular to that of the tertiary stack structure 122. For example, as shown in FIGS. 7A and 7B, if the tertiary stack structure 122 laterally extends in the X-direction, the first portions 135*a* of the routing structures 132 may individually laterally extend in the Y-direction (e.g., the negative Y-direction). The spacing (e.g., distance in the X-direction) between the first portions 135*a* of adjacent routing structures 132 may correspond to the spacing between the adjacent contact structures 130 associated with (e.g., coupled to) the adjacent routing structures 132. Each of the first portions 135*a* of the routing structures 132 may exhibit a different length in the Y-direction, or at least one of the first portions 135*a* of the routing structures 132 may exhibit substantially the same length in the Y-direction as at least one other of the first portions 135*a* of the routing structures 132. In some embodiments, each of the first portions 135*a* of the routing structures 132 exhibits a different length in the Y-direction. For example, as shown in FIGS. 7A and 7B, in embodiments wherein the contact structures 130 are formed on or over a single (e.g., only one) additional staircase structure 126 (e.g., the first additional staircase structure 126*a* or the second additional staircase structure 126*b*), lengths of the first portions 135*a* of the routing structures 132 may progressively increase or may progressively decrease in a direction extending from a top of the additional staircase structure 126 to a bottom of the additional staircase structure 126. In additional embodiments, at least one of the first portions 135*a* of the routing structures 132 exhibits substantially the same length in the Y-direction as at least one other of the first portions 135*a* of the routing structures 132. For example, in embodiments wherein the contact structures 130 are formed on or over a single (e.g., only one) additional staircase structure 126 (e.g., the first additional staircase structure 126*a* or the second additional staircase structure 126*b*), a length of a first portion 135*a* of one routing structure 132 associated with the additional staircase structure 126 may be substantially the same as a length of a first portion 135*a* of another routing structure 132 associated with the additional staircase structure 126. As another example, in embodiments wherein the contact structures 130 are formed on or over multiple (e.g., more than one) additional staircase structures 126 (e.g., the first additional staircase structure 126*a* and the second additional staircase structure 126*b*), a length of a first portion 135*a* of a routing structure 132 associated with one of the additional staircase structures 126 (e.g., the first additional staircase structure 126*a*) may be substantially the same as a length of a first portion 135*a* of another routing structure 132 associated with another of the additional staircase structures 126 (e.g., the second additional staircase structure 126*b*).

The second portion 135*b* of each of the routing structures 132 may longitudinally extend in a direction perpendicular to that of the first portion 135*a* of each of the routing structures 132. For example, as shown in FIG. 7A, if the first portions 135*a* of the routing structures 132 individually laterally extend in the Y-direction, the second portions 135*b* of the routing structures 132 may individually longitudinally extend in the Z-direction (e.g., the negative Z-direction). The spacing (e.g., distances in the X-direction and the Y-direction) between the second portions 135*b* of adjacent routing structures 132 may correspond to the spacing (e.g., in the X-direction) and lengths (e.g., in the Y-direction) of the first portions 133*a* of the adjacent routing structures 132. Each of the second portions 135*b* of the routing structures 132 may exhibit substantially the same length in the Z-direction, or at least one of the second portions 135*b* of the routing structures 132 may exhibit a different length in the Z-direction than at least one other of the second portions 135*b* of the routing structures 132. In some embodiments, each of the second portions 135*b* of the routing structures 132 exhibits substantially the same length in the Z-direction. In additional embodiments, at least one of the second portions 135*b* of the routing structures 132 exhibits a different length in the Z-direction than at least one other of the second portions 135*b* of the routing structures 132.

The third portion 135*c* of each of the routing structures 132 may laterally extend in a direction perpendicular to that of the second portion 135*b* of each of the routing structures 132 and parallel to that of the tertiary stack structure 122. For example, as shown in FIGS. 7A and 7B, if the second portions 135*b* of the routing structures 132 individually longitudinally extend in the Z-direction and the tertiary stack structure 122 laterally extends in the X-direction, the third portions 135*c* of the routing structures 132 may individually longitudinally extend in the X-direction (e.g., the negative X-direction and/or the positive X-direction). The spacing (e.g., distances in the Y-direction and the Z-direction) between the third portions 135*c* of adjacent routing structures 132 may correspond to the lengths (e.g., in the X-direction) of the first portions 135*a* of the adjacent routing structures 132 and the lengths (e.g., in the Z-direction) of the second portions 135*b* of the adjacent routing structures 132. Each of the third portions 135*c* of the routing structures 132 may exhibit a different length in the X-direction, or at least one of the third portions 135*c* of the routing structures 132 may exhibit substantially the same length in the X-direction as at least one other of the third portions 135*c* of the routing structures 132. In some embodiments, each of the third portions 135*c* of the routing structures 132 exhibits a different length in the X-direction. For example, as shown in FIGS. 7A and 7B, in embodiments wherein the contact structures 130 are formed on or over a single (e.g., only one) additional staircase structure 126 (e.g., the first additional staircase structure 126*a* or the second additional staircase structure 126*b*), lengths of the third portions 135*c* of the routing structures 132 may progressively increase or may progressively decrease in a direction extending from away of the additional staircase structures 126 in the Y-direction. In additional embodiments, at least one of the third portions 135*c* of the routing structures 132 exhibits substantially the same length in the x-direction as at least one other of the third portions 135*c* of the routing structures 132. For example, in embodiments wherein the contact structures 130 are formed on or over a single (e.g., only one) additional staircase structure 126 (e.g., the first additional staircase structure 126*a* or the second additional staircase structure 126*b*), a length of a third portion 135*c* of one routing structure 132 associated with the additional staircase structure 126 may be substantially the same as a length of a third portion 135*c* of another routing structure 132 associated with the additional staircase structure 126. Third portions 135*c* of routing structures 132 associated with the same additional staircase structure 126 and exhibiting substantially the same length as one another may, for example, outwardly extend in the same direction (e.g., the negative X-direction or the positive X-direction). As another example, in embodiments wherein the contact structures 130 are formed on or over multiple (e.g., more than one) additional staircase structures 126 (e.g., the first additional staircase structure 126a and the second additional staircase structure 126b), a length of a third portion 135c of a routing structure 132 associated with one of the additional staircase structures 126 (e.g., the first additional staircase structure 126a) may be substantially the same as a length of a first portion 135a of another routing structure 132 associated with another of the additional staircase structures 126 (e.g., the second additional staircase structure 126b). Third portions 135c of routing structures 132 associated with different additional staircase structures 126 and exhibiting substantially the same length as one another may, for example, outwardly extend in opposite directions (e.g., the negative X-direction and the positive X-direction).

Figure 7C:
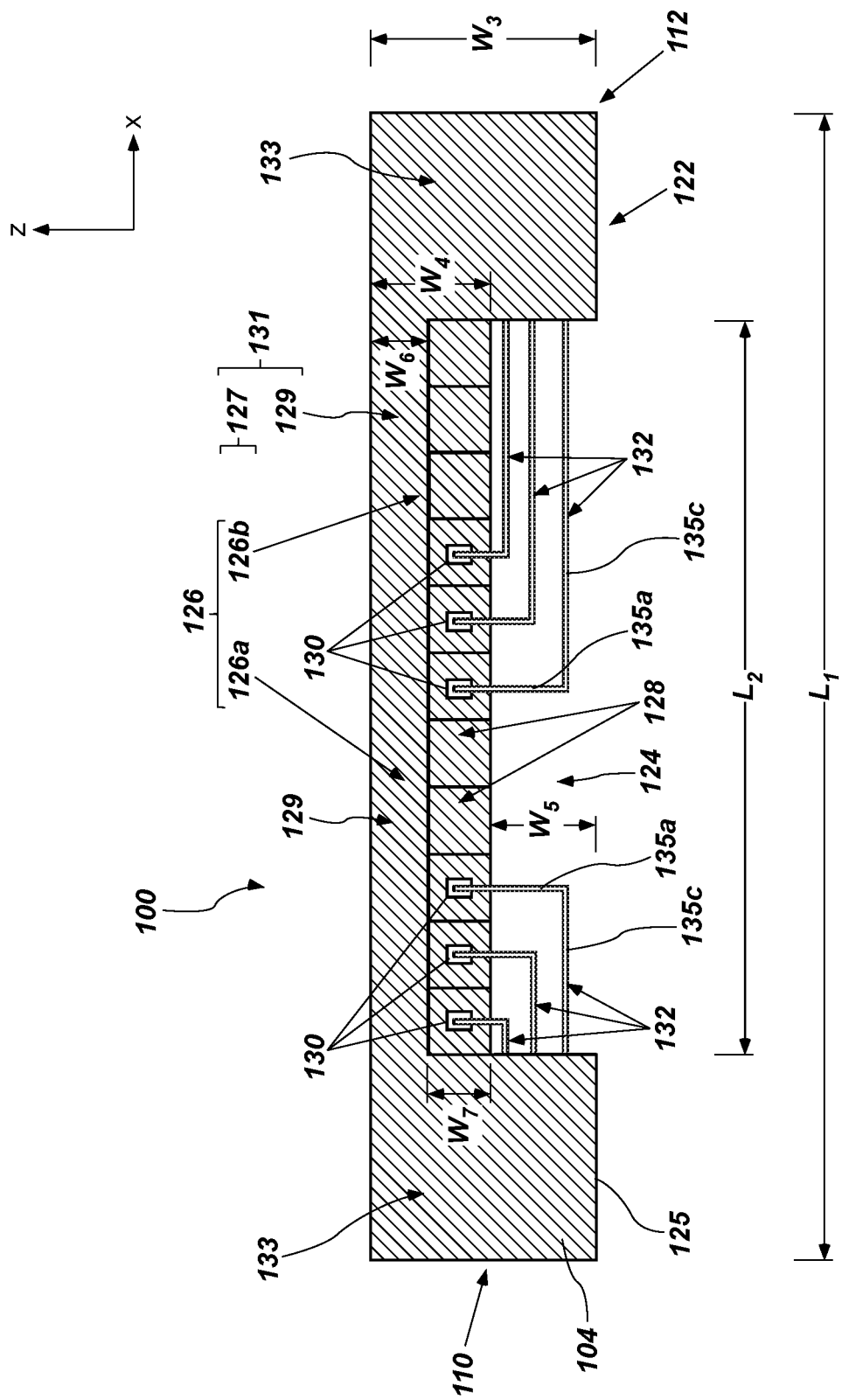

Each of the routing structures 132 may extend to the same string driver device 134, or at least one of the routing structures 132 may extend to a different string driver device 134 than at least one other of the routing structures 132. In some embodiments, each of the routing structures 132 to the same string driver device 134. In additional embodiments, a first group of the routing structures 132 extend to one string driver device 134, and a second group of the routing structures 132 extend to another string driver device 134. By way of non-limiting example, as shown in FIG. 7C, which is a top-down view of an alternate configuration of the semiconductor device structure 100 in accordance with an additional embodiment of the disclosure, a first group of the routing structures 132 may extend to a string driver device 134 (FIG. 7A) underlying the tertiary stack structure 122 and located proximate the first end 110 of the tertiary stack structure 122, and a second group of the routing structures 132 may extend to another string driver device 134 (FIG. 7A) underlying the tertiary stack structure 122 and located proximate the second, opposing end 112 of the tertiary stack structure 122. Extending the first group of the routing structures 132 and the second group of the routing structures 132 to different string driver device 134 may reduce the likelihood of capacitive coupling between adjacent routing structures 132 by increasing the spacing (e.g., distance) between one or more portions (e.g., the second portions 135b, the third portions 135c) of the adjacent routing structures 132. In addition, in further embodiments wherein two or more of the additional staircase structures 126 extend in parallel with one another in the X-direction (e.g., such as the arrangement of the additional staircase structures 126' of the tertiary stack structure 122' depicted in FIGS. 5C and 5D), the routing structures 132 associated with each of the additional staircase structures 126 may extend to the same string driver device 134, or one or more the routing structures 132 associated with at least one of the additional staircase structures 126 may extend to a different string driver device 134 than one or more other of the routing structures 132. Whether each of the routing structures 132 extend to the same string driver device 134 (e.g., as depicted in FIGS. 7A and 7B), or whether at least some of the routing structures 132 extend to different string driver devices 134 than one another (e.g., as depicted in FIG. 7C), the continuous conductive paths across the tertiary stack structure 122 provided by the configurations of the conductive structures 104 permit an individual switching device (e.g., an individual transistor, such as an individual FET) of an individual string driver device 134 to drive voltages completely across (e.g., from the first end 110 to the second, opposing end 112) and/or in opposing directions across (e.g., toward the first end 110 and toward the second, opposing end 112) an individual tier 108 electrically connected thereto.

The routing structures 132 may be formed of and include at least one conductive material, such as a metal (e.g., W, Ti, Mo, Nb, V, Hf, Ta, Cr, Zr, Fe, Ru, Os, Co, Rh, Ir, Ni, Pd, Pt, Cu, Ag, Au, Al), a metal alloy (e.g., a Co-based alloy, an Fe-based alloy, a Ni-based alloy, an Fe- and Ni-based alloy, a Co- and Ni-based alloy, an Fe- and Cu-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped silicon, conductively-doped germanium, conductively-doped silicon germanium), or combinations thereof. Each of the routing structures 132 may have substantially the same material composition, or at least one of the routing structures 132 may have a different material composition than at least one other of the routing structures 132. Synergy The routing structures 132 and the string driver devices 134 may each independently be formed using conventional processes (e.g., conventional deposition processes, conventional photolithography processes, conventional material removal processes) and conventional processing equipment, which are not described in detail herein.

Furthermore, in accordance with embodiments of the disclosure, a semiconductor device structure comprises a stack structure, contact structures, and routing structures. The stack structure has opposing end sections exhibiting a first width and an interior section laterally intervening between the opposing end sections and exhibiting a second width smaller than the first width. The stack structure comprises stacked tiers each comprising a conductive structure and an insulating structure longitudinally adjacent the conductive structure, a stadium structure within the interior section and comprising opposing staircase structures each having steps comprising lateral ends of the stacked tiers, and an elongate middle region directly laterally adjacent a first side of the stadium structure within the interior section and laterally extending completely between the opposing end sections. The contact structures are coupled to the conductive structures of the stacked tiers at the steps of one or more of the opposing staircase structures of the stadium structure. The routing structures are coupled to the contact structures and extend from the contact structures, through an opening directly laterally adjacent a second side of the stadium structure, and to at least one string driver device underlying the stack structure.

Figure 8:
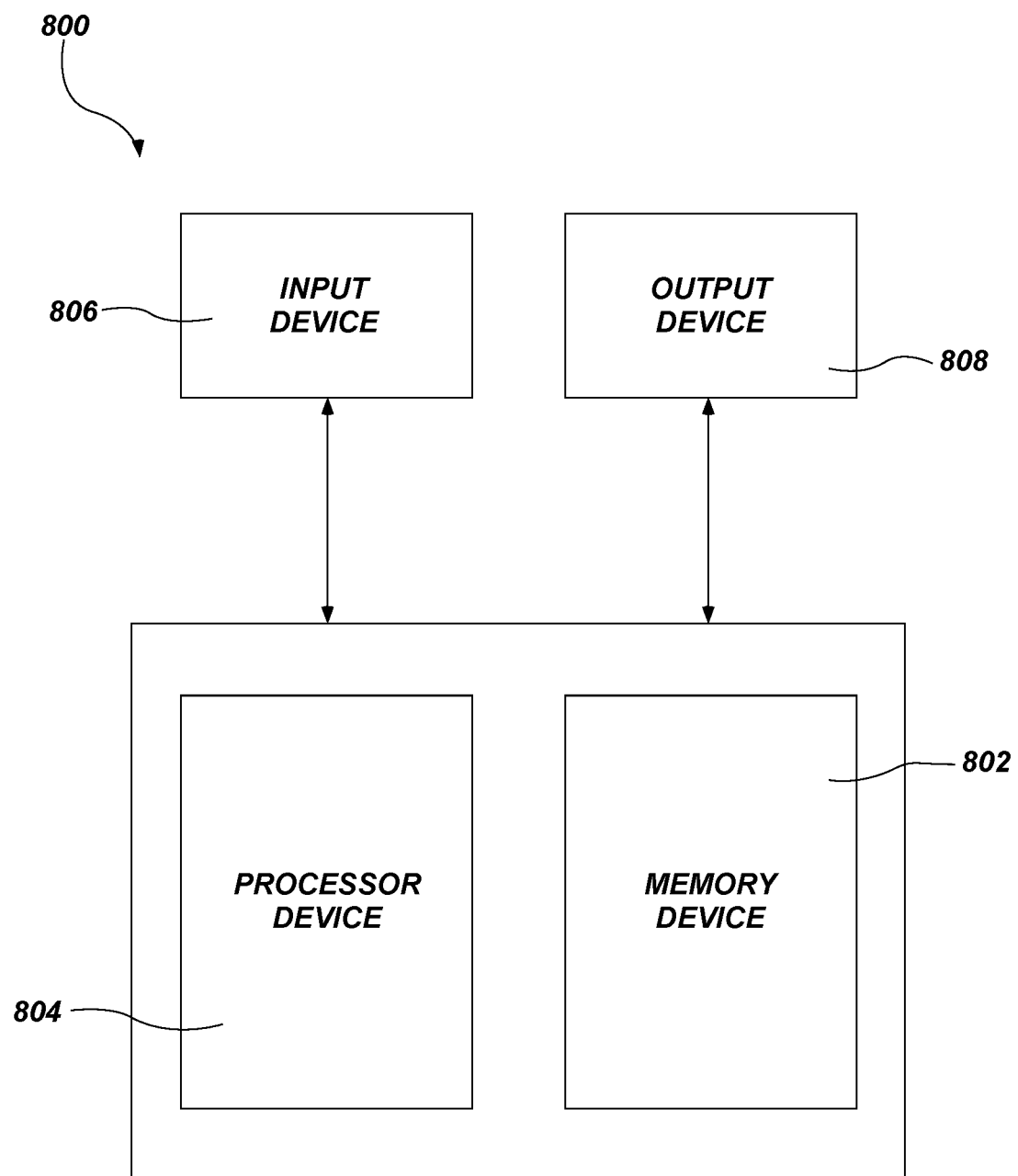
FIG. 8 is a schematic block diagram illustrating an electronic system in accordance with embodiments of the disclosure.

Semiconductor devices (e.g., memory devices, such as 3D NAND Flash memory devices) including semiconductor device structures (e.g., the semiconductor device structure 100) in accordance with embodiments of the disclosure may be used in embodiments of electronic systems of the disclosure. For example, FIG. 8 is a block diagram of an illustrative electronic system 800 according to embodiments of disclosure. The electronic system 800 may comprise, for example, a computer or computer hardware component, a server or other networking hardware component, a cellular telephone, a digital camera, a personal digital assistant (PDA), portable media (e.g., music) player, a WiFi or cellular-enabled tablet such as, for example, an iPad® or SURFACE® tablet, an electronic book, a navigation device, etc. The electronic system 800 includes at least one memory device 802. The at least one memory device 802 may include, for example, an embodiment of the semiconductor device structure 100 shown in FIGS. 7A and 7B. The electronic system 800 may further include at least one electronic signal processor device 804 (often referred to as a "microprocessor"). The electronic signal processor device 804 may, optionally, include a semiconductor device structure similar to an embodiment of the semiconductor device structure 100 shown in FIGS. 7A and 7B. The electronic system 800 may further include one or more input devices 806 for inputting information into the electronic system 800 by a user, such as, for example, a mouse or other pointing device, a keyboard, a touchpad, a button, or a control panel. The electronic system 800 may further include one or more output devices 808 for outputting information (e.g., visual or audio output) to a user such as, for example, a monitor, a display, a printer, an audio output jack, a speaker, etc. In some embodiments, the input device 806 and the output device 808 may comprise a single touch screen device that can be used both to input information to the electronic system 800 and to output visual information to a user. The one or more input devices 806 and output devices 808 may communicate electrically with at least one of the memory device 802 and the electronic signal processor device 804.

Thus, in accordance with embodiments of the disclosure, an electronic system comprises at least one semiconductor device structure comprising a stack structure exhibiting opposing end sections having a first width and an interior section laterally intervening between the opposing end sections and having a second width smaller than the first width. The stack structure comprises stacked tiers each comprising a conductive structure and an insulating structure longitudinally adjacent the conductive structure, a stadium structure within the interior section and comprising opposing staircase structures having steps comprising lateral ends of the stacked tiers, and an elongate middle region directly adjacent a side of the stadium structure within the interior section and extending completely between the opposing ends sections.

The methods and structures of the disclosure may decrease the number of switching devices and interconnections required to drive voltages completely across and/or in different directions across a conductive structure of a tier as compared to conventional methods and structures associated with various semiconductor devices (e.g., memory devices, such as 3D NAND Flash memory). The methods and structures of the disclosure may permit a single switching device to drive an access line (e.g., word line) of a memory cell array from a more centralized (e.g., middle, non-edge) location, which may reduce resistancexcurrent (RC) delay by one-fourth (¼) as compared to conventional methods and structures. In addition, the methods and structures of the disclosure may permit the interconnections utilized to drive voltages across different tiers to be spaced farther apart from one another without increasing the lateral dimensions of the tiers, which may reduce undesirable capacitive coupling between the interconnections as compared to conventional methods and structures while maintaining or even decreasing feature sizes. The methods and structures of the disclosure may reduce costs (e.g., manufacturing costs, material costs) and performance, scalability, efficiency, and simplicity as compared to conventional methods and structures.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A method of forming a semiconductor device structure, comprising:
    forming a stack structure comprising stacked tiers each comprising a conductive structure and an insulating structure vertically adjacent the conductive structure;
    forming a masking structure over a portion of the stack structure;
    removing portions of the stacked tiers of the stack structure not covered by the masking structure to form a secondary stack structure comprising at least one stadium structure having steps comprising lateral ends of the stacked tiers, the at least one stadium structure comprising a first staircase structure and a second staircase structure that mirrors the first staircase structure;
    removing the masking structure after forming the secondary stack structure;
    removing portions of the secondary stack structure to form a tertiary stack structure comprising:
        opposing end sections exhibiting a first width in a first horizontal direction;
        an interior section horizontally laterally intervening between the opposing end sections in a second horizontal direction orthogonal to the first horizontal direction and exhibiting a second width in the first horizontal direction smaller than the first width, the interior section comprising:
            at least one additional stadium structure exhibiting a smaller width in the first horizontal direction than the at least one stadium structure of the secondary stack structure, and comprising a first additional staircase structure and a second additional staircase structure that mirrors the first staircase structure; and
            an elongate middle region extending in the first horizontal direction and directly adjacent a first side of the at least one additional stadium structure in the second horizontal direction; and
        an opening horizontally adjacent, in the first horizontal direction, a second side of the at least one additional stadium structure opposing the first side, the opening vertically extending completely through the tertiary stack structure and horizontally extending in the second horizontal direction continuously across an entire length of the at least one additional stadium structure, additional conductive structures of the tertiary stack structure laterally extending from additional steps of the at least one additional stadium structure and completely across the elongate middle region of the interior section;
    coupling at least one contact structure to one or more of the additional conductive structures of the tertiary stack structure at one or more of the additional steps of the at least one additional stadium structure; and
    forming at least one routing structure coupled to the at least one contact structure and extending from the at least one contact structure, through the opening, and to at least one string driver device.

2. The method of claim 1, wherein removing portions of the secondary stack structure comprises removing portions of the at least one stadium structure to form the at least one additional stadium structure and the opening horizontally laterally adjacent the second side of the at least one additional stadium structure.

3. The method of claim 1, further comprising:
coupling at least one contact structure to the conductive structure of one or more of the stacked tiers at one or more steps of the at least one additional stadium structure; and
forming at least one routing structure coupled to and extending between the at least one contact structure and at least one string driver device.

4. The method of claim 1, wherein coupling at least one contact structure to one or more of the additional conductive structures comprises forming multiple contact structures on multiple additional steps of the at least one additional stadium structure.

5. The method of claim 4, wherein forming the multiple contact structures on multiple additional steps of the at least one additional stadium structure comprises aligning the multiple contact structures on the multiple additional steps of the at least one additional stadium structure.

6. The method of claim 1, wherein forming at least one routing structure comprises:
forming a first portion of the at least one routing structure to outwardly laterally extend from the at least one contact structure in a direction perpendicular to the tertiary stack structure;
forming a second portion of the at least one routing structure to longitudinally extend away from the first portion in an additional direction perpendicular to the direction of the first portion; and
forming a third portion of the at least one routing structure to outwardly laterally extend away from the second portion and to the at least one string driver device in another direction perpendicular to the additional direction of the second portion and parallel to the tertiary stack structure.

7. The method of claim 1, wherein:
coupling at least one contact structure to one or more of the additional conductive structures of the tertiary stack structure comprises coupling multiple contact structures to multiple additional conductive structures of the tertiary stack structure; and
forming at least one routing structure comprises forming multiple routing structures each independently coupled to and extending between the multiple contact structures and the at least one string driver device.

8. The method of claim 7, wherein forming multiple routing structures each independently coupled to and extending between the multiple contact structures and the at least one string driver device comprises coupling the multiple routing structures to switching devices of only one string driver device.

9. A method of forming a semiconductor device structure, comprising:
forming stacked tiers each comprising a conductive structure and an insulating structure vertically adjacent the conductive structure;
removing portions of the stacked tiers to form a stadium structure having steps comprising lateral ends of the stacked tiers, the stadium structure comprising a first staircase structure having a generally positive slope and a second staircase structure mirroring the first staircase structure and having a generally negative slope;
removing a portion of the stadium structure to form an opening vertically extending completely through the stacked tiers, the opening horizontally adjacent a first side of a remaining portion the stadium structure in a first horizontal direction and horizontally extending continuously across an entire length of the stadium structure in a second horizontal direction orthogonal to the first horizontal direction, conductive structures of the stacked tiers horizontally extending from the steps of the remaining portion of the stadium structure completely across a second side of the remaining portion of the stadium structure opposing the first side to form continuous conductive paths laterally extending completely across the stacked tiers in the second horizontal direction;
coupling at least one contact structure to the conductive structure of one or more of the stacked tiers at one or more of the steps of the remaining portion of the stadium structure; and
coupling at least one routing structure to the at least one contact structure, the at least one routing structure extending from the at least one contact structure, through the opening, and to at least one string driver device.

10. The method of claim 9, wherein removing portions of the stacked tiers to form a stadium structure comprises:
forming a hard mask material over a portion of the stacked tiers;
selectively etching the stacked tiers using to the hard mask material to form the stadium structure.

11. The method of claim 9, wherein coupling at least one contact structure to the conductive structure of one or more of the stacked tiers at one or more of the steps of the remaining portions of the stadium structure comprises coupling multiple, substantially aligned contact structures to the steps of the remaining portions of the stadium structure.

12. The method of claim 9, wherein coupling at least one routing structure to the at least one contact structure comprises forming the at least one routing structure to comprise:
at least one first portion coupled to the at least one contact structure and outwardly laterally extending in a direction oriented perpendicular to the stacked tiers;
at least one second portion coupled to the at least one first portion and longitudinally extending through the opening in an additional direction oriented perpendicular to the direction of the at least one first portion; and
at least one third portion coupled to the at least one second portion and outwardly laterally extending in another direction oriented perpendicular to the additional direction of the at least one second portion and parallel to the stacked tiers.

13. The method of claim 9, wherein coupling at least one routing structure to the at least one contact structure comprises coupling multiple routing structures to multiple contact structures, some of the multiple routing structures extending to a first string driver device underlying the stacked tiers, and other of the multiple routing structures extending to a second string driver device underlying the stacked tiers.

14. A method of forming a semiconductor device structure, comprising:
forming a stack structure comprising tiers each comprising a conductive structure and an insulating structure longitudinally adjacent the conductive structure;
forming an opening vertically extending completely through the stack structure;
removing remaining portions of the stack structure horizontally adjacent the opening in a first horizontal direction to form a stadium structure adjacent the opening in the first horizontal direction and comprising a first staircase structure having a generally positive slope and a second staircase structure extending in series with the first staircase structure and having a generally negative slope, conductive structures of the tiers of the stack structure terminating at steps of the stadium structure and forming continuous conductive paths horizontally extending completely across the tiers in a second horizontal direction orthogonal to the first horizontal direction;

coupling contact structures to the steps of the at least one staircase structure; and coupling routing structures to the contact structures, the routing structures extending from contact structures, through the opening, and to one or more string driver devices.

15. The method of claim 14, wherein:

forming an opening extending through the stack structure comprises:
- forming a masking material over a portion of the stack structure; and
- removing another portion of the stack structure not covered by the masking material; and removing remaining portions of the stack structure laterally adjacent the opening comprises:
- removing a portion of the masking material; and
- selectively etching the stack structure using a remaining portion of the masking material.

\* \* \* \* \*

UNITED STATES PATENT AND TRADEMARK OFFICE
CERTIFICATE OF CORRECTION

PATENT NO. : 10,748,918 B2
APPLICATION NO. : 15/875407
DATED : August 18, 2020
INVENTOR(S) : Toru Tanzawa It is certified that error appears in the above-identified patent and that said Letters Patent is hereby corrected as shown below:

In the Specification
        Column 1, Line 10, change "Feb. 27, 2018 the" to --Feb. 27, 2018, the--

In the Claims
    Claim 1, Column 24, Line 24, change "horizontally laterally intervening" to --horizontally intervening--
    Claim 2, Column 24, Line 66, change "horizontally laterally adjacent" to --horizontally adjacent--

Signed and Sealed this
Seventeenth Day of November, 2020

Andrei Iancu
*Director of the United States Patent and Trademark Office*